United States Patent
Toyomura et al.

(10) Patent No.: US 7,612,283 B2
(45) Date of Patent: Nov. 3, 2009

(54) SOLAR POWER GENERATION APPARATUS AND ITS MANUFACTURING METHOD

(75) Inventors: Fumitaka Toyomura, Shiga (JP); Nobuyoshi Takehara, Shiga (JP)

(73) Assignee: Canon Kabushiki Kaisha, Tokyo (JP)

( * ) Notice: Subject to any disclaimer, the term of this patent is extended or adjusted under 35 U.S.C. 154(b) by 650 days.

(21) Appl. No.: 10/991,450

(22) Filed: Nov. 19, 2004

(65) Prior Publication Data

US 2005/0121067 A1 Jun. 9, 2005

Related U.S. Application Data

(63) Continuation of application No. PCT/JP2003/008659, filed on Jul. 8, 2003.

(30) Foreign Application Priority Data

Jul. 9, 2002 (JP) .............................. 2002-200525

(51) Int. Cl.
*H01L 31/00* (2006.01)
*H01L 31/042* (2006.01)
(52) U.S. Cl. .................. 136/244; 136/256; 136/293
(58) Field of Classification Search .......... 136/256, 136/293
See application file for complete search history.

(56) References Cited

U.S. PATENT DOCUMENTS

| | | | | |
|---|---|---|---|---|
| 4,773,944 A | | 9/1988 | Nath et al. ................... 136/249 |
| 5,353,189 A | * | 10/1994 | Tomlinson ................... 361/118 |
| 5,397,401 A | | 3/1995 | Toma et al. .................. 136/259 |
| 5,589,006 A | | 12/1996 | Itoyama et al. ............... 136/248 |
| 5,660,643 A | | 8/1997 | Toggweiler ................... 136/244 |
| 5,677,833 A | * | 10/1997 | Bingley ........................ 363/71 |
| 5,849,107 A | | 12/1998 | Itoyama et al. ............... 136/248 |
| 6,066,797 A | * | 5/2000 | Toyomura et al. ........... 136/251 |
| 6,093,884 A | | 7/2000 | Toyomura et al. ........... 136/244 |
| 6,093,885 A | | 7/2000 | Takehara et al. ............. 136/244 |
| 6,107,560 A | | 8/2000 | Takehara et al. ............. 136/248 |

(Continued)

FOREIGN PATENT DOCUMENTS

DE 40 32 569 4/1992

(Continued)

OTHER PUBLICATIONS

Meier et al. (Complete microcrystalline p-i-n. solar cell- Crystalline or amorphous cell behavior?; Appl. Phys. Lett. 65(7), Aug. 15, 1994).*

(Continued)

*Primary Examiner*—Alex Noguerola
*Assistant Examiner*—Dustin Q Dam
(74) *Attorney, Agent, or Firm*—Fitzpatrick, Cella, Harper & Scinto

(57) ABSTRACT

A solar cell assembly including a plurality of solar cells is formed on a common substrate, and a DC/DC converter which converts the output from the solar cell is connected to each solar cell to constitute a solar power generation apparatus. The output from the solar power generation apparatus is converted into an AC power by an inverter and supplied to a load or commercial AC power system. Since the arrangement is simplified, the manufacturing cost can be reduced, and the influence of partial shade or a variation in characteristic decreases.

2 Claims, 23 Drawing Sheets

U.S. PATENT DOCUMENTS

| | | | |
|---|---|---|---|
| 6,169,678 B1 | 1/2001 | Kondo et al. | 363/71 |
| 6,184,457 B1 | 2/2001 | Tsuzuki et al. | 136/256 |
| 6,207,889 B1 | 3/2001 | Toyomura et al. | 136/244 |
| 6,222,117 B1 * | 4/2001 | Shiozaki | 136/256 |
| 6,226,196 B1 * | 5/2001 | Toshinari et al. | 363/134 |
| 6,245,987 B1 | 6/2001 | Shiomi et al. | 136/244 |
| 6,259,017 B1 | 7/2001 | Takehara et al. | 136/293 |
| 6,262,558 B1 * | 7/2001 | Weinberg | 320/101 |
| 6,265,653 B1 * | 7/2001 | Haigh et al. | 136/249 |
| 6,278,954 B1 | 8/2001 | Lim et al. | 702/99 |
| 6,331,670 B2 | 12/2001 | Takehara et al. | 136/244 |
| 6,512,458 B1 | 1/2003 | Kobayashi et al. | 340/635 |
| 6,556,396 B1 | 4/2003 | Takehara et al. | 361/42 |
| 6,587,051 B2 | 7/2003 | Takehara et al. | 340/635 |
| 6,593,520 B2 | 7/2003 | Kondo et al. | 136/244 |
| 6,594,127 B2 | 7/2003 | Takehara et al. | 361/42 |
| 6,657,118 B2 | 12/2003 | Toyomura et al. | 136/244 |
| 6,678,174 B2 | 1/2004 | Suzui et al. | 363/55 |
| 6,713,890 B2 | 3/2004 | Kondo et al. | 290/40 |
| 6,717,519 B2 | 4/2004 | Kobayashi et al. | 340/635 |
| 6,753,692 B2 | 6/2004 | Toyomura et al. | 324/718 |
| 6,791,024 B2 | 9/2004 | Toyomura | 136/251 |
| 6,838,611 B2 | 1/2005 | Kondo et al. | 136/244 |
| 6,856,497 B2 | 2/2005 | Suzui et al. | 361/42 |
| 2001/0040453 A1 * | 11/2001 | Toyomura et al. | 324/332 |
| 2002/0029799 A1 * | 3/2002 | Yoda et al. | 136/251 |
| 2002/0085325 A1 * | 7/2002 | Suzui et al. | 361/42 |
| 2002/0085397 A1 * | 7/2002 | Suzui et al. | 363/37 |
| 2002/0170592 A1 * | 11/2002 | Algora | 136/244 |
| 2003/0010373 A1 * | 1/2003 | Tsuzuki et al. | 136/244 |
| 2003/0210562 A1 | 11/2003 | Takehara et al. | 363/24 |
| 2003/0234038 A1 | 12/2003 | Kurokami et al. | 136/255 |
| 2004/0075486 A1 | 4/2004 | Takehara | 327/427 |
| 2004/0080304 A1 | 4/2004 | Takehara | 323/282 |
| 2004/0144418 A1 | 7/2004 | Takehara | 136/244 |
| 2004/0159102 A1 | 8/2004 | Toyomura et al. | 60/641.8 |
| 2004/0222873 A1 | 11/2004 | Toyomura | 336/182 |
| 2004/0223351 A1 | 11/2004 | Kurokami et al. | 363/65 |

FOREIGN PATENT DOCUMENTS

| | | |
|---|---|---|
| EP | 1263113 A2 * | 12/2002 |
| ES | 2160555 A2 * | 11/2001 |
| JP | 6-309047 | 11/1994 |
| JP | 8-70533 | 3/1996 |
| JP | 11-186572 | 7/1999 |
| JP | 2000-112545 | 4/2000 |
| WO | WO 95/01654 | 1/1995 |
| WO | WO 95/26067 | 9/1995 |

OTHER PUBLICATIONS

M. Meinhardt, et al., "Multi-String-Converter With Reduced Specific Costs And Enhanced Functionality", Solar Energy, vol. 69 (Suppl.), Nos. 1-6, 2000, pp. 217-227.

* cited by examiner

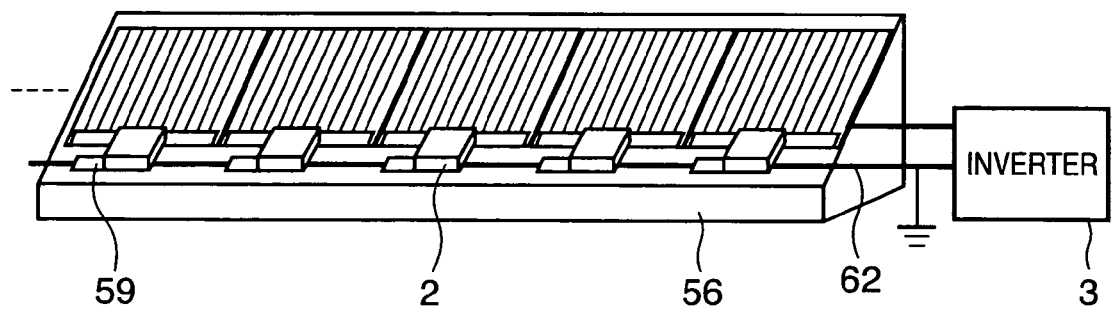
F I G. 10

F I G. 14
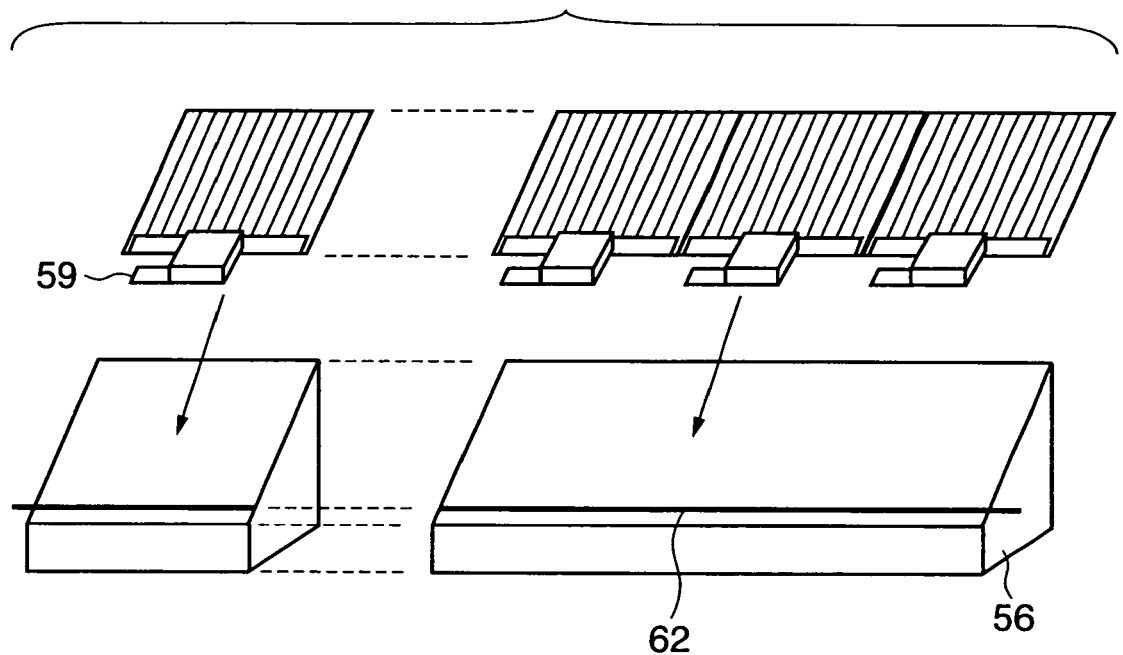

F I G. 17
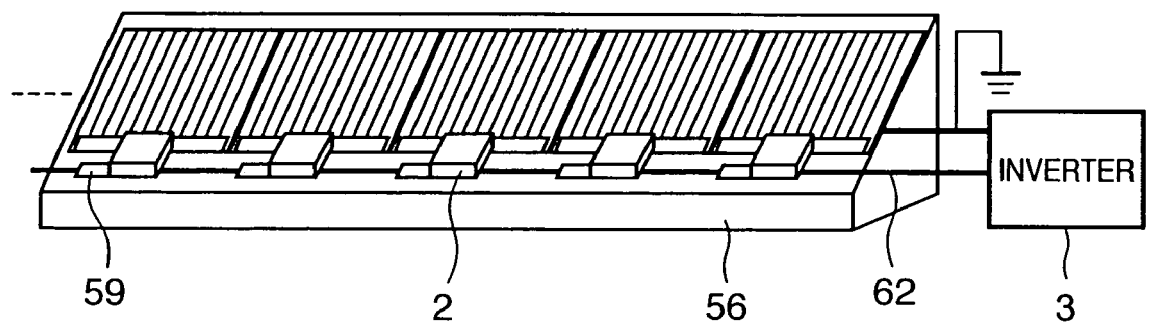

SOLAR POWER GENERATION APPARATUS AND ITS MANUFACTURING METHOD

This application is a continuation of International Application No. PCT/JP2003/008659, filed Jul. 8, 2003.

TECHNICAL FIELD

The present invention relates to a solar power generation apparatus, a solar power generation system, and a method of manufacturing the solar power generation apparatus and, more particularly, to a solar power generation apparatus and solar power generation system, which have a plurality of solar cells formed on a common substrate and a method of manufacturing the solar power generation apparatus.

BACKGROUND ART

As problems such as global warming due to emission of $CO_2$ and the like by use of fossil fuel and radioactive contamination due to accidents at nuclear power plants or radioactive waste are becoming increasingly serious in recent years, there has been a growing interest in global environment and energy. Under these circumstances, solar power generation that uses sunlight as an unlimited source of clean energy, geothermal power generation that uses geothermal heat, wind power generation that uses wind power, and the like have been put into practical use worldwide.

There are various forms of solar power generation using solar cells in correspondence with output scales ranging from several W to several thousand kW. In a typical solar power generation system using solar cells, a DC power generated by the solar cells is converted (DC/AC-converted) into an AC power by an inverter or the like and supplied to the loads of subscriber's houses or a commercial AC power system (to also be simply referred to as a "system" hereinafter).

FIG. 2 is a view showing the schematic arrangement of a conventional general solar power generation system. As shown in FIG. 2, in a general solar power generation system 8, a plurality of solar cells are connected in series to form a solar battery module 6 as a unit. A plurality of solar battery modules 6 are further connected in series to construct a solar battery string 7 (also called a solar battery array). In addition, a plurality of solar battery strings 7 are connected in parallel to form a solar battery array. A DC power from the solar battery array is collected by a collection box 9. The collected power is converted into an AC power by an inverter 3 and connected to a load 4 or system 5.

In the solar power generation system 8, if the outputs from the plurality of solar battery strings 7 are different due to the influence of a variation in output characteristic between the solar cells or partial shade by buildings or the like, the solar power generation system 8 may be unable to operate at the maximum power point.

To cope with this problem, Japanese Patent Laid-Open No. 2000-112545 discloses a solar power generation system in which a DC/DC converter is connected to each solar battery array through a connection box, and all DC output powers are input to an inverter at once and converted into an AC power. According to this arrangement, each DC/DC converter executes maximum power point tracking control for a corresponding solar battery array. Hence, the accuracy of maximum power point tracking control of the solar power generation system increases.

Japanese Patent Laid-Open No. 8-70533 discloses a technique in which an inverter is connected to each solar battery array, each solar battery module, or each solar cell to reduce the output variation between the solar battery modules or solar cells or the power efficiency difference due to partial shade. This arrangement that attaches an inverter to each solar battery module or solar cell can also cope with an increase or decrease in power generation amount by solar batteries at a low cost.

However, these prior arts have the following problems.

In the solar power generation system which inputs the DC output from the solar battery array or solar battery module to the DC/DC converter, as disclosed in Japanese Patent Laid-Open No. 2000-112545 or 6-309047, a solar battery module must be formed by connecting a plurality of solar cells in series.

Generally, formation of solar battery modules is time-consuming because it requires a number of processes including a cutting step of dividing a substrate having an electromotive layer formed thereon into solar cells, an end portion etching step of forming non-power-generation regions that insulate the solar cells from each other, a step of sequentially connecting the solar cells in series by using wiring members such as interconnects, a step of connecting a bypass diode to reduce the influence of partial shade, a step of covering the series-connected solar cells, and a step of fitting a frame into the end portion of the covered structure. In addition, since the members to be used are expensive, the price of solar power generation apparatuses increases.

Especially, when a large solar battery module is to be manufactured, the step of connecting a number of solar cells in series takes a time and labor. This poses a serious problem in manufacturing a large solar battery module.

When the solar cells are to be connected in series using wiring members such as interconnectors, gaps to receive the interconnectors must be formed between the solar cells. The number of gaps increases as the number of series-connected solar cells increases. Hence, the area of the non-power-generation regions in the solar battery module increases. As a consequence, the area power generation efficiency of the solar battery module decreases.

Furthermore, since the solar cells are connected in series, the influence of partial shade on the power generation efficiency is also large. For example, if one of the solar cells connected in series is partially shaded, the amount of current generated by that cell decreases. This cell also rate-determines currents generated by the remaining cells.

To reduce the influence of partial shade, a bypass diode must be connected in parallel with each of the series-connected solar cells. However, even when this method is used, the influence of partial shade on the remaining power generating cells cannot be completely eliminated.

Particularly, as described in Japanese Patent Laid-Open No. 8-70533, when an inverter is connected to each solar cell, labor for the above-described series connection step may be reduced. However, a time and labor are still necessary for the cutting step and etching step for the end portion of each solar cell in forming solar cells.

When the solar cells should be installed on a support, they must be accurately installed at a predetermined interval for the sake of electrical insulation between the solar cells, appearance, and improvement of the area power generation efficiency. However, this work is difficult and increases the cost.

U.S. Pat. No. 4,773,944 discloses a solar battery module which is formed by parallel-connecting all solar cells formed on one substrate. This structure should solve the above-described problems such as the cumbersomeness of the series connection step, the increase in cost, the influence of partial shade, and the difficulty in installation.

In this solar battery module, a bus bar for current collection is connected to the current collection electrodes of the solar cells so that the outputs from the plurality of cells are collected and output.

In this arrangement, however, the current that flows through the current collection bus bar has a value corresponding to the sum of outputs currents of the plurality of cells. Hence, when the number of solar cells increases, and the area of the solar battery module becomes large, the loss in current collection considerably increases.

To solve the problem of current collection loss, the sectional area of the current collection bus bar is increased. However, if this measure is taken, the weight and volume of the current collection bus bar become very large, resulting in difficulty in manufacture and transportation.

DISCLOSURE OF THE INVENTION

It is an object of the present invention to provide a solar power generation apparatus which can reduce the manufacturing cost with a simple structure and also reduce the influence of partial shade and a variation in characteristic.

It is another object of the present invention to provide a solar power generation system which can reduce the manufacturing cost with a simple structure and also reduce the influence of partial shade and a variation in characteristic.

It is still another object of the present invention to provide a method of manufacturing a solar power generation apparatus which can reduce the manufacturing cost with a simple structure and also reduce the influence of partial shade and a variation in characteristic.

In order to achieve the above objects, according to an aspect of the present invention, there is provided a solar power generation apparatus comprising, a plurality of solar cells formed on a common substrate, and a plurality of converters which are connected to the solar cells, respectively, to convert outputs from the connected solar cells.

In order to achieve the above objects, according to another aspect of the present invention, there is provided a solar power generation system comprising, a plurality of solar cells formed on a common substrate, a plurality of DC/DC converters which are connected to said solar cells, respectively, to convert outputs from the connected solar cells, and an inverter which converts an AC power output from said plurality of DC/DC converters into an AC power.

In order to achieve the above objects, according to still another aspect of the present invention, there is provided a method of manufacturing a solar power generation apparatus comprising steps of, forming a solar cell on a conductive substrate by a semiconductor manufacturing process, etching the solar cell at a predetermined interval to divide the solar cell into a plurality of solar cells, and connecting a DC/DC converter to each of the plurality of solar cells.

That is, in the present invention, a plurality of solar cells are formed on a common substrate, and a converter which converts the output from the solar cell is connected to each solar cell to constitute a solar power generation apparatus.

The plurality of solar cells are formed on one substrate. Hence, the cutting step, end portion etching step, series connection step, and bypass diode connection step, which are necessary for manufacturing a conventional general solar battery module, can be omitted. Accordingly, the manufacture and material cost decreases, and the area power generation efficiency of the solar power generation apparatus largely increases.

In addition, the work for installing the solar cells at a predetermined interval can be executed for each solar power generation apparatus, the time required for installing the solar power generation apparatus can greatly be shortened, and the cost of installation can be reduced.

Partial shade affects only the solar cell with the partial shade and not the remaining solar cells. Furthermore, since the plurality of solar cells are formed on the common substrate, the variation in characteristic between the solar cells is small. Hence, as compared to the conventional system having series connected solar cells, the influence of partial shade or a variation in characteristic can be greatly reduced.

The converter may comprise a DC/DC converter, which boosts a DC voltage output from the solar cell.

In this case, each of the DC/DC converters may be attached to a corresponding one of the solar cells.

The plurality of solar cells may be arrayed in a line on the substrate.

The plurality of solar cells may be formed on the substrate by a semiconductor manufacturing process, and each solar cell may be separated from the remaining solar cells by etched portions.

The solar cell and the power converter may be connected by a wiring member, which has an exposed portion at least at a part of a live part.

The solar cell may comprise a photoelectric conversion layer, and a collection electrode, a surface wiring member, and a transparent thin-film resin layer, which are arranged on a light-receiving surface side of said photoelectric conversion layer, and one of the current collection electrode and the surface wiring member may have, at least at a part, an exposed portion which is not covered with the transparent thin-film resin layer.

In this case, the photoelectric conversion layer may comprise a thin-film silicon layer. Further, the substrate may comprise a conductive substrate, and the photoelectric conversion layer may have a positive pole on a side of the substrate.

The substrate may comprise a conductive substrate, and one of the outputs from the solar cells and one of the outputs from the DC/DC converters may be electrically connected to the substrate.

In this case, both of one of the outputs from the solar cells and one of the outputs from the DC/DC converters may be on a low voltage side, or on a high voltage side.

Preferably, the substrate has portions having no solar cells on two of peripheral sides.

In this case, the apparatus may be fixed to a support through the portions having no solar cells.

The solar cells may be sealed with a resin.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a schematic view showing the outer appearance of a solar power generation system according to the second embodiment;

FIG. 14 is a view showing a method of installing the solar power generation system shown in FIG. 10;

FIG. 17 is a schematic view showing the outer appearance of a solar power generation system according to the third embodiment;

BEST MODE FOR CARRYING OUT THE INVENTION

Preferred embodiments of the present invention will now be described in detail in accordance with the accompanying drawings.

FIRST EMBODIMENT

Figure 1:
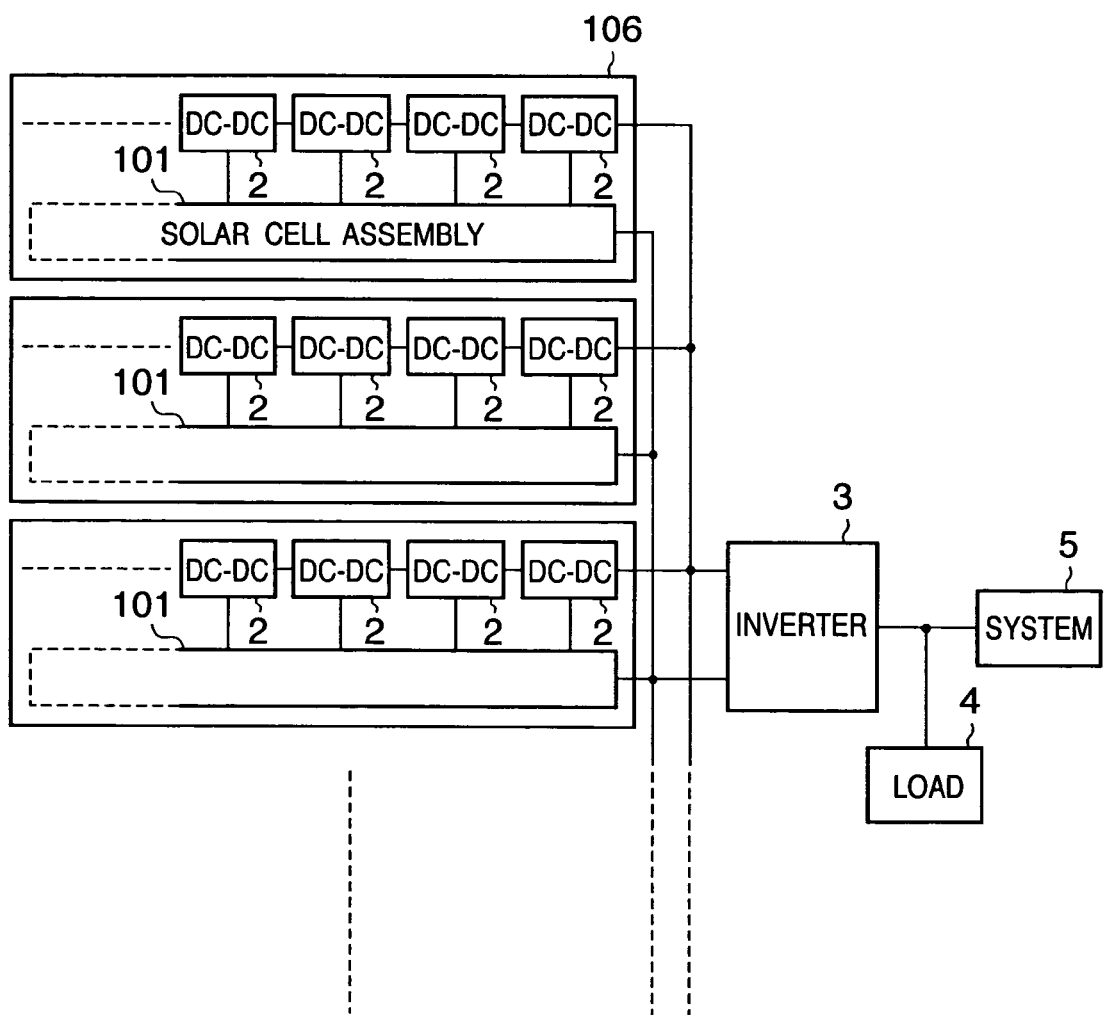
FIG. 1 is a schematic view showing the arrangement of a solar power generation system according to the first embodiment of the present invention.
Figure 2:
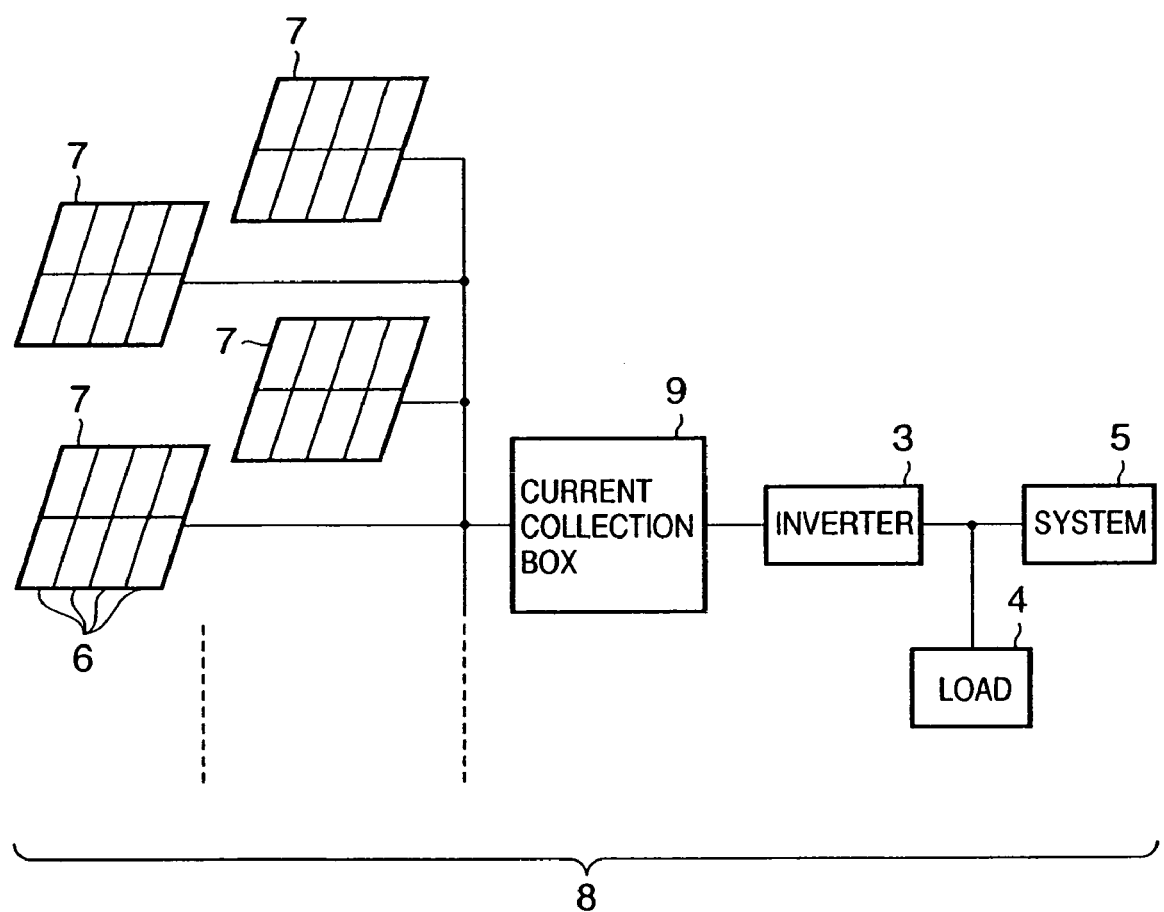
FIG. 2 is a view showing the schematic arrangement of a conventional general solar power generation system.

FIG. 1 is a schematic view showing the arrangement of a solar power generation system according to the first embodiment of the present invention. The solar power generation system comprises solar cell assemblies 101 each constructed by a plurality of solar cells formed on one conductive substrate, DC/DC converters 2, an inverter 3, a load 4, and a system 5.

In this specification, a solar cell is a structure having a photo voltaic layer divided into a predetermined region. A solar cell is a minimum unit having a function as a solar battery capable of extracting a power from its photovoltaic layer.

The plurality of solar cells in the solar cell assembly 101 are independent from each other. They are not connected in series. A DC power output from each solar cell is input to a corresponding one of the DC/DC converters 2 that are arranged in a one-to-one correspondence with the solar cells. The DC powers are boosted at a predetermined boost ratio. All the outputs from the DC/DC converters 2 are input to the inverter 3 at once, converted into an AC power having a commercial frequency, and supplied to the load 4. An extra power is transmitted to the system 5.

In the following description, a module 106 that comprises the solar cell assemblies 101 and the DC/DC converters 2 connected to the solar cells will be referred to as a solar power generation apparatus.

Constituent elements used in the solar power generation system according to this embodiment will be described below in detail.

[Solar Cell Assembly]

Figure 3:
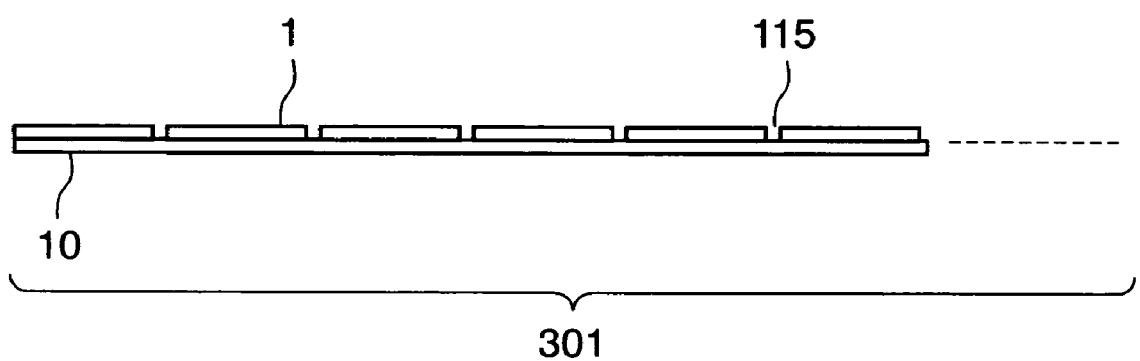
FIG. 3 is a sectional view showing the structure of a solar cell assembly shown in FIG. 1.

FIG. 3 is a sectional view of a solar cell assembly 301 formed on one conductive substrate. Solar cells 1 divided by etching lines 115 are formed on a conductive substrate 10. One of the poles of each solar cell 1 is electrically commonly connected by the conductive substrate 10. The conductive substrate 10 will be described later in detail.

Figure 4:
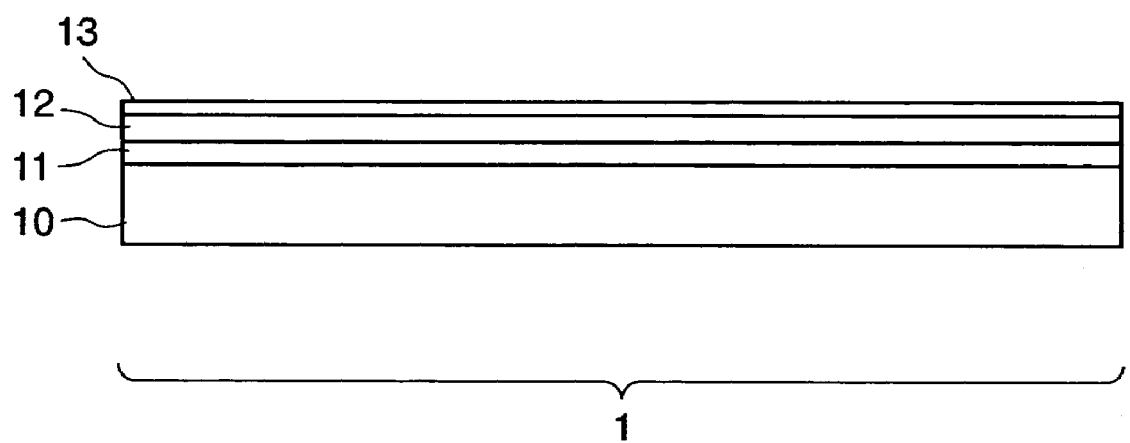
FIG. 4 is a sectional view showing the structure of each solar cell shown in FIG. 1.

The detailed structure of each solar cell 1 will be described with reference to FIG. 4. As the solar cell 1, a structure obtained by forming a lower electrode layer 11, semiconductor layer 12, and upper electrode layer 13 on the conductive substrate 10 is used. The lower electrode layer 11 maybe omitted depending on the structure of the conductive substrate.

The conductive substrate is preferably rolled up in advance. Continuous film formation such as a roll-to-roll method in which the layers are formed while sequentially feeding the substrate and rewinding it at the other end is preferably employed from the viewpoint of productivity. A case wherein this scheme is used will mainly be described here. A batch apparatus can also be used.

The lower electrode layer 11, semiconductor layer 12, and upper electrode layer 13 used here are described in detail in Japanese Patent Laid-Open No. 11-186572 filed by the present applicant. These constituent elements are not directly relevant to the present invention, and a detailed description thereof will be omitted.

The semiconductor layer 12 is preferably made of a thin silicon film and, more preferably, amorphous silicon. When amorphous silicon is used as the semiconductor layer, it normally uses a pin junction formed by sequentially forming an n-type semiconductor, i-type semiconductor, and p-type semiconductor from the side of the conductive substrate 10.

A double or triple structure having two or three pin junctions is also preferably used.

In this embodiment, an nip junction formed by forming a p-type semiconductor, i-type semiconductor, and n-type semiconductor from the side of the conductive substrate 10 is also preferably be used in some cases.

The method of forming each layer can be appropriately selected from various known methods such as deposition, sputtering, high-frequency plasma CVD, microplasma CVD, ECR, thermal CVD, and LPCVD.

The thus formed solar cell is cut into a plurality of cells. To prevent any short circuit between the conductive substrate and the upper electrode layer, which occurs at cutting, from affecting the effective light-receiving range, an etching paste containing $FeCl_3$, $AlCl_3$, or the like is applied to the upper electrode layer by screen printing. The resultant structure is heated and cleaned to linearly remove part of the upper electrode layer of the solar cell, thereby forming the etching lines 115 as shown in FIG. 3.

Figure 5:
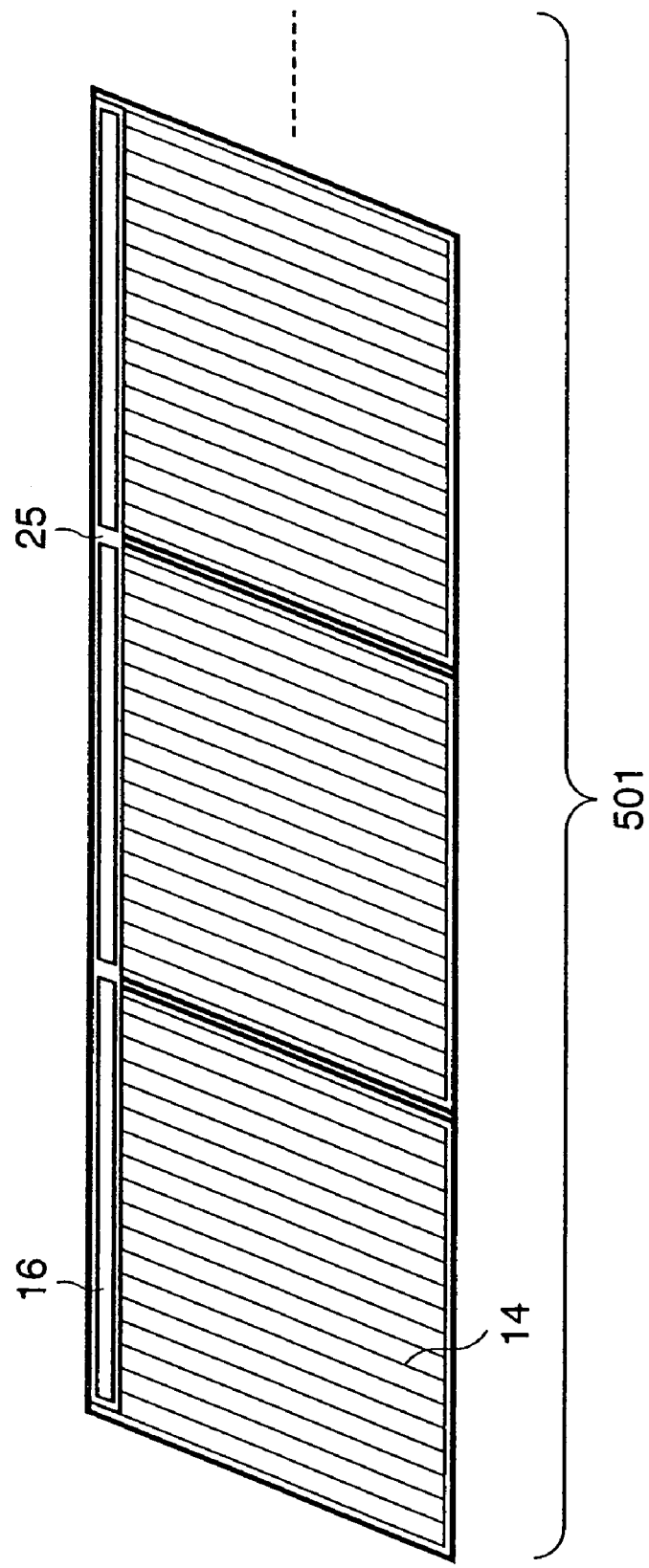
FIG. 5 is an explanatory view of a step of manufacturing the solar cell assembly shown in FIG. 1.

As shown in FIG. 5, a double-coated adhesive tape 25, which has insulation property is continuously bonded to one side of the light-receiving surface of the conductive substrate. Current collection electrodes 14 are formed on the double-coated adhesive tape 25 and upper electrode at a predetermined interval. Light-receiving surface terminal members 16 are attached to the upper portion of the double-coated adhesive tape 25 by thermal contact bonding. The current collection electrode 14 used here will be described later in detail.

With the above process, a solar cell assembly 501 with the current collection electrodes 14 and light-receiving surface terminal members 16, as shown in FIG. 5, is manufactured.

Figure 6:
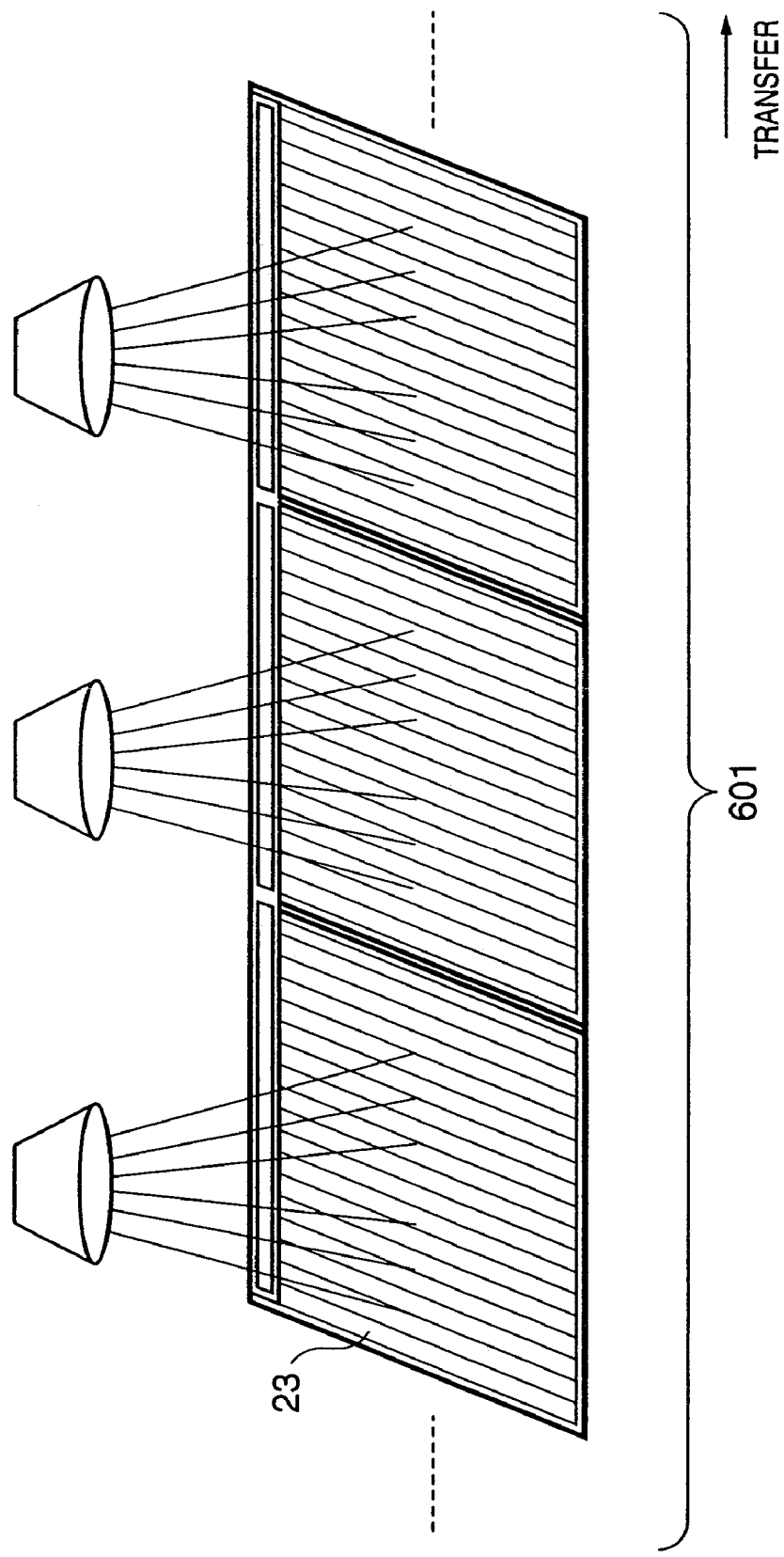
FIG. 6 is an explanatory view of the step of manufacturing the solar cell assembly shown in FIG. 1.

In addition, as shown in FIG. 6, a transparent thin-film resin layer 23 is formed on the light-receiving surface of the solar cell assembly. The structure and forming method of the transparent thin-film resin layer will be described later in detail.

At this time, the transparent thin-film resin layer 23 is formed not on the entire light-receiving surface but on only part of it to form a solar cell assembly 601, as will be described later in detail. According to this structure, since no extra insulating material is required, the cost of the solar power generation apparatus or the entire system can be reduced.

More specifically, instead of forming the transparent thin-film resin layer on the entire surface of the solar cell assembly 501, the transparent thin-film resin layer is formed only at minimum necessary portions so that any adverse effect on the power generation performance under the outdoor environment can be prevented. That is, no transparent thin-film resin layer is formed on the light-receiving surface terminal members 16 and etching lines 115. Only portions (active areas) having a photoelectric conversion characteristic for at least incident light on the solar cells are covered.

The solar cell assembly 501 of the present invention may be protected from the outdoor environment by encapsulating the solar cell assembly with a weather-resistant film, a filler, or a back reinforcing member in the next step, like a conventional solar battery module. This structure can also be used in the present invention.

When the solar cell assembly 601 having the transparent thin-film resin layer 23 formed thereon is cut into a desired length along the etching lines, a solar power generation system with a desired output can easily be constituted.

When the DC/DC converter 2 (to be described later in detail) is electrically connected to each of the plurality of solar cells, a solar power generation apparatus 701 can be constituted.

The constituent elements of the solar cell 1 according to this embodiment will be described below in detail.

[Conductive Substrate]

The conductive substrate used in the solar cell assembly according to this embodiment is a member which mechanically supports the semiconductor layer for photoelectric conversion. The conductive substrate can be used as an electrode on the non-light-receiving surface side of the solar cell. The substrate preferably has a resistance to the temperature in forming the semiconductor layer.

The conductive substrate serves as a matching pair when the solar cell assembly is bonded onto the support. Hence, the conductive substrate is preferably made of a material having good adhesion to the adhesive to be used.

When the conductive substrate is to be fixed on the support using a fixing member, the substrate preferably has a mechanical strength, weather resistance, and corrosion resistance to withstand fixing.

Examples of the material of the conductive substrate are metals such as Fe, Ni, Cr, Al, Mo, Au, Nb, Ta, V, Ti, Pt, and Pb and an alloy thereof, a thin plate of brass or stainless steel and a composite thereof, carbon sheet, and galvanized sheet.

The substrate may be made of an electrically insulating material. Examples are films or sheets made of heat-resistant synthetic resins such as polyester, polyethylene, polycarbonate, cellulose acetate, polypropylene, polyvinyl chloride, polyvinylidene chloride, polystylene, polyamide, polyimide, and epoxy; composites of these materials and glass fiber, carbon fiber, boron fiber, or metal fiber; and a thin plate of the metal or resin sheet having a surface with a deposited or formed metal thin film of a different material.

[Current Collection Electrode]

The current collection electrode is generally formed into a comb shape on the semiconductor layer or upper electrode layer of the solar cell. The preferable width or pitch is determined for the sheet resistance value of the semiconductor layer or upper electrode layer.

The current collection electrode is also required to have a low resistivity and not to become a series resistance of the solar battery. The resistivity is preferably $10^{-2}$ Ωcm to $10^{-6}$ Ωcm. As the material of the current collection electrode, a metal such as Ti, Cr, Mo, W, Al, Ag, Ni, Cu, Sn, or Pt or an alloy thereof, or a metal line having a surface coated with solder or a conductive adhesive is used. Generally, a metal paste made of metal powder and polymer resin binder is used. However, the material is not limited to this.

[Terminal Member]

The terminal member is electrically connected to the current collection electrode to form a positive or negative extraction electrode. The terminal member is attached to the etching surface of the conductive substrate or solar cell, from which the upper electrode layer is removed, by using laser welding, a conductive adhesive, or brazing to have a low electrical resistance and high mechanical strength. Alternatively, the terminal member is attached onto the current collection electrode by pressing. In this specification, a "light-receiving surface terminal member" and "non-light-receiving surface terminal member" are discriminated in accordance with the position where the terminal member is attached to the solar cell.

The electrical performance required of the terminal member and its material are almost the same as those of the current collection electrode. The terminal member preferably has a foil shape to maintain the flatness of the solar cell and ensure a low resistance.

The non-light-receiving surface terminal member may be formed into a comb or radial shape on the entire non-light-receiving surface to increase the current collection efficiency.

When a terminal member to connect a DC/DC converter or inverter is necessary, the terminal member is connected to the light-receiving surface terminal member or non-light-receiving surface terminal member by using laser welding, a conductive adhesive, or brazing.

[Transparent Thin-Film Resin Layer]

The transparent thin-film resin layer located on the light-receiving surface of the solar cell according to this embodiment is not particularly limited as long as it is a transparent film capable of covering and protecting the underlying current collection electrode, upper electrode layer, and the like.

The transparent thin-film resin layer, however, preferably has excellent coating property, weather resistance, and adhesive property. Especially, a transparent thin-film resin layer having a good water resistance is required.

Detailed examples of materials are fluorocarbon resin, acrylate resin, polyester, and polycarbonate. More specifically, polyvinylidene fluoride (PVDF) resin, polyvinyl fluoride [PVF] resin, or tetrafluoroethylene-ethylene copolymer (ETFE) resin can be used. Polyvinylidene fluoride resin is excellent in weather resistance. Tetrafluoroethylene-ethylene copolymer resin has both high weather resistance and high mechanical strength and also high transparency. To reduce the cost, not a film material but an acrylic- or fluorine-based transparent coating is preferably used. In this case, the transparent thin-film resin layer is formed by a coating method such as curtain coating to be normally used for coating.

Because of the requirement for manufacturing, the resin coating that can use curtain flow preferably has a low viscosity of about 0.3 Pa.s or less. To further increase the productivity, spray coating is preferably used. In this case, a resin coating having a viscosity of 0.05 Pa.s or less is preferable. The lower limit value of the viscosity is not particularly limited and can appropriately be selected from desired film thicknesses. As the viscosity decreases, the number of times of coating necessary for obtaining the desired film thickness increases. Practically, the viscosity is preferably 0.001 Pa.s or more.

The thickness after formation of the transparent thin-film resin layer is preferably 1 µm or more because this thickness allows coating without any pinhole. The thickness is more preferably about 200 ||m or more from the following viewpoints. When covering and protection of the current collection electrode, upper electrode layer, or photovoltaic layer are taken into consideration, the transparent thin-film resin layer is preferably thicker. However, as the transparent thin-film resin layer becomes thicker, the transmission to sunlight decreases, and the power generation performance degrades. In addition, when a thick layer is formed, the flexibility of the resin layer may degrade. When the layer is thick, the current collection electrode, upper electrode layer, or photovoltaic layer may break upon shrinkage in hardening. In outdoor use, if the thickness of the resin layer exceeds about 200 µm, it cannot follow up the force in thermal expansion or in installation. Hence, the resin layer may receive stress to form cracks or peel off at the interface to the current collection electrode, upper electrode layer, or photovoltaic layer.

The transparent thin-film resin layer need not always be formed from one of material. For example, a transparent thin-film resin layer having a two-layered structure may be formed using two materials. A layer immediately above the upper electrode layer of the solar cell may be formed from a material with a good adhesion to the upper electrode layer, and a layer on this layer may be made of a material having a high weather resistance.

As a typical formation method in this case, the coating step may be executed twice.

[Parallel Connection Member]

To construct the solar power generation system according to this embodiment, parallel connection between the DC/DC converters 2 connected to the solar cells is necessary. A member that connects the DC/DC converters 2 is a parallel connection member. In the solar cell assembly of this embodiment, when the conductive substrate is used as a common terminal on one side, this member is used for only the pole on one side.

More specifically, this member is used to connect one output terminal of each DC/DC converter. A general-purpose insulating electrical wire or insulating cable may be used. In this embodiment, a bare conductor without any insulating coating can also be used. As a bare conductor, a copper wire, copper stranded wire, or copper band is preferably used.

In this embodiment, the connection member between each DC/DC converter and the inverter is defined as an interdevice connection member. The interdevice connection member can also use the same shape and material as those of the parallel connection member.

The parallel connection member used to connect the DC/DC converters may be directly extended and connected to the inverter in place of the interdevice connection member.

[Support]

The support is a member which fixes the solar cell assembly. Generally, the support indicates a member which forms a frame or installation surface.

The means for fixing the solar cell assembly to the support is not particularly limited. A method of fixing the solar cell assembly using an adhesive is preferably used because the area of non-power-generation regions in the solar cell assembly can be small. Alternatively, a non-power-generation region for installation may be formed at part of the solar cell assembly, and that portion may be fixed with a fixing member such as a nail, screw, or bolt.

In this embodiment, a concrete material is preferably used because the structure is simplified, and installation is facilitated. If the support is made of a heavy material such as concrete, installation of the support (frame) can be completed only placing it on the ground. In addition, concrete has a high outdoor durability and is inexpensive. Hence, it can conveniently be used as the frame of the solar battery.

The support is preferably separately constituted by, e.g., a plate-shaped fixing support (support) that fixes the solar battery and a back support on which the fixing support is installed. After the back support having, e.g., a cubic shape is installed, the plate-shaped fixing support is leaned against the back support. This is convenient because the installation angle of the solar battery can be arbitrarily changed.

The DC/DC converter and inverter according to this embodiment will now be described in detail.

[DC/DC Converter]

Generally, the DC/DC converter connected to the solar cell comprises a boost circuit which boosts a DC voltage to the input voltage of the inverter circuit, a control circuit which controls activation/stop of power conversion, optimization of the operating point of the solar battery, and the operation mode, a system-connected protection circuit, a communication circuit, and input and output terminals. The output from the DC/DC converter may be directly connected to the load. However, generally, outputs from a plurality of DC/DC converters are input to one inverter, and an AC power obtained by conversion is used by the load or interconnected to the system.

As the boost circuit, various known insulating or non-insulating circuit arrangements can be used. The control circuit comprises, e.g., a CPU, a PWM waveform control circuit, a maximum power point tracking control circuit, a control power supply generation circuit, a frequency/voltage reference generator, and a switching control circuit. The control circuit may be externally operated through a communication line. Alternatively, some of the functions of the control circuit may be arranged outside the DC/DC converter to control a plurality of power converters at once.

However, to simplify the structure as much as possible and realize cost reduction and higher reliability, the DC/DC converter according to this embodiment preferably has a control circuit comprising at least a control power supply generation circuit, a switching reference waveform generation circuit which defines a switching frequency, and a switching element driving circuit capable of driving a switching element at a fixed duty.

The main circuit preferably has a switching element ON/OFF-controlled by the switching element driving circuit and a switching transformer having a predetermined turn ratio.

In the system in which the plurality of DC/DC converters are connected in parallel, when the input voltage of the inverter on the output side is changed, the input voltage of the DC/DC converter can be changed. Accordingly, the operating point of the solar cell can be moved.

When each DC/DC converter is formed as a chip and electrically connected to the surface wiring member and conductive substrate during the solar cell manufacturing step, the series of works for connecting the DC/DC converter to the solar cell can be simplified.

The DC/DC converter is preferably arranged near the solar cell to efficiently input the output from the solar cell. The DC/DC converter is preferably directly attached to the solar cell.

The encapsulating material of the DC/DC converter must have characteristics such as a thermal resistance, humidity resistance, water resistance, electrical insulating property, low temperature resistance, oil resistance, weather resistance, shock resistance, and water resistance in accordance with the use conditions. The encapsulating material preferably has a good adhesion to an adhesive to firmly fix the DC/DC converter to the solar cell or back reinforcing member.

When the above factors are taken into consideration, examples of plastic materials that can be used as the encapsulating material are resins such as polycarbonate, polyamide, polyacetal, modified PPO (PPE), polyester, polyallylate, unsaturated polyester, phenol resin, epoxy resin, polybutylene terephthalate, and nylon; and an engineering plastic. Thermoplastic resins such as ABS resin, polypropylene,-and polyvinyl chloride can also be used.

When the DC/DC converter is attached to the light-receiving surface side, carbon black is preferably used as a pigment or a resin coating that absorbs UV rays is preferably applied to the surface to increase the UV light resistance.

[Inverter]

Generally, the inverter used in the solar power generation system comprises a boost circuit which boosts an input DC voltage to the input voltage of the inverter circuit, an inverter circuit which converts a DC power into an AC power, a control circuit which controls activation/stop of power conversion, optimization of the operating point of the solar battery, and the operation mode, a grid-connected protection circuit, a communication circuit, and input and output terminals. The output from the inverter is used by the load or interconnected to the system.

As the boost circuit, various known insulating or non-insulating circuit schemes can be used. The inverter circuit is preferably a voltage type inverter which uses an IGBT or MOSFET as a switching element. By driving the gate of the switching element by the control signal of the control circuit, an AC power having desired frequency, phase, and voltage can be obtained.

The control circuit comprises, e.g., a CPU, a PWM waveform control circuit, a frequency/voltage reference generator, a maximum power point tracking control circuit, a current reference generator, a mode switching device, and a switching control circuit. When a plurality of inverters according to this embodiment are connected to the plurality of solar cells, respectively, the control circuit may be externally operated through a communication line. Alternatively, control circuits themselves may be arranged at one point outside the inverters to control the plurality of inverters at once.

When the inverter according to this embodiment is to be electrically connected to the solar cell, the inverter 3 is preferably arranged near the solar cell to efficiently input the output from the solar cell. The inverter is preferably directly connected to the solar cell.

As the inverter 3, either an inverter with an isolating transformer or an inverter having no isolating transformer can be used in accordance with the application purpose. When the interdevice connection member between the DC/DC converter and the inverter is grounded, an inverter with an isolating transformer is used.

The inverter must have characteristics such as a thermal resistance, humidity resistance, water resistance, electrical insulating property, low temperature resistance, oil resistance, weather resistance, shock resistance, and water resistance in accordance with the use conditions. The inverter is preferably made of a material that has a good adhesion to an adhesive to firmly fix the inverter to the solar cell.

When the above factors are taken into consideration, examples of plastic materials that can be used as the encapsulating material are resins such as polycarbonate, polyamide, polyacetal, modified PPO (PPE), polyester, polyallylate, unsaturated polyester, phenol resin, epoxy resin, polybutylene terephthalate, and nylon; and an engineering plastic. Thermoplastic resins such as ABS resin, polypropylene, and polyvinyl chloride can also be used.

When the inverter is attached to the light-receiving surface side, carbon black is preferably used as a pigment or a resin coating that absorbs UV rays is preferably applied to the surface to increase the UV light resistance.

[Manufacturing Method]

A manufacturing method according to this embodiment will be described below in detail.

Figure 7:
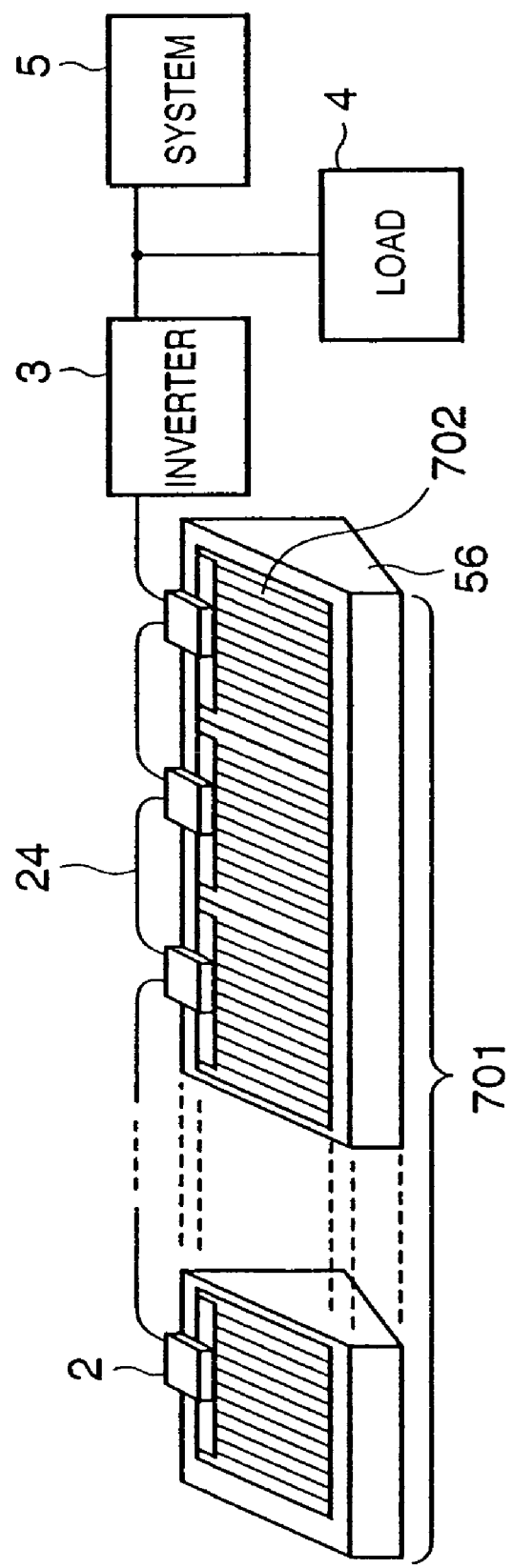
FIG. 7 is a schematic view showing the outer appearance of the solar power generation system according to the first embodiment.

FIG. 7 is a schematic view showing the outer appearance of the solar power generation system according to this embodiment. Reference numeral 702 denotes a solar cell assembly having the above-described structure; 2, a DC/DC converter; 3, an inverter; 4, a load; and 5, a system.

More specifically, as a conductive substrate, a cleaned and rolled long stainless substrate having a thickness of 0.1 mm, a width of 250 mm, and a length of 300 m is transferred. First, an Al layer containing 1% Si is formed to a layer thickness of 5,000 Å by sputtering as a lower electrode layer 11. Next, a p/i/n amorphous silicon semiconductor layer 12 is formed. For the n-type semiconductor, $PH_3$, $SiH_4$, and $H_2$ gases are used. For the i-type semiconductor, $SiH_4$ and $H_2$ gases are used. For the p-type semiconductor, $B_2H_6$, $SiH_4$, and $H_2$ gases are used. A 300-Å thick n-type semiconductor layer, 4000-Å thick i-type semiconductor layer, and 100-Å thick p-type semiconductor layer are sequentially formed by plasma CVD in film formation apparatuses through which the stainless substrate passes.

Then, a 800-Å thick ITO layer is formed by resistive heating deposition as an upper electrode layer.

To divide the thus formed photovoltaic layer into a plurality of parts, an etching paste containing $FeCl_3$, $AlCl_3$, or the like is applied to the upper electrode at desired division portions by screen printing. The resultant structure is heated and cleaned to linearly remove part of the upper electrode and form 1-mm wide etching lines at an interval of 250 mm. Thus, 10 photovoltaic layers separated by the etching lines are formed.

As shown in FIG. 5, a 7.5-mm wide polyimide-substrate double-coated adhesive tape 25 as a double-coated adhesive tape is continuously bonded to one side of the light-receiving surface side of the conductive substrate (thickness: 200 μm (substrate: 100 μm)).

Next, a carbon wire prepared by coating a copper wire having a diameter of 100 μm with a carbon paste in advance is formed in the power generation regions of the photovoltaic layer and on the polyimide-substrate double-coated adhesive tape 25, thereby forming current collection electrodes 14.

Light-receiving surface terminal members 16 formed from a silver-plated copper foil having a width of 5 mm, a length of 245 mm, and a thickness of 100 μm are placed on the polyimide-substrate double-coated adhesive tape 25 and thermally contact-bonded together with the current collection electrodes 14 at 200° C. and 3 kg/cm for 180 sec.

As shown in FIG. 6, a fluorocarbon resin coating is applied to the light-receiving surface of a solar cell assembly 601 to a thickness of 100 μm by spray coating, thereby forming a transparent thin-film resin layer 23.

In this case, only portions (active areas) having a photoelectric conversion characteristic for incident light on the solar cells are covered.

The roll is cut along the etching lines at an interval of 2,510 mm. A solar cell assembly 702 in which 10 solar cells are formed on the same conductive substrate, and a transparent thin-film resin layer is formed thereon is obtained.

In addition, as a connection terminal to the DC/DC converter 2, an extending member (not shown) is connected to the light-receiving surface terminal member 16 and conductive substrate 10. The DC/DC converter 2 is bonded using a silicone adhesive to partially cover the light-receiving surface terminal member 16. In the DC/DC converter 2, the extending member is connected to the input terminal of the DC/DC converter 2. Then, the cover of the DC/DC converter 2 is closed. In this way, a solar cell assembly (solar power generation apparatus 701) having the DC/DC converter, as shown in FIG. 7, is constructed.

Furthermore, the solar power generation apparatus 701 is bonded to a support 56 using an epoxy resin adhesive.

The DC/DC converters 2 attached to the respective solar cells are sequentially connected by a connection cable 24 to input the outputs from the DC/DC converters to the inverter 3 at once.

The connection cable 24 contains two, positive and negative electrical cables. In each DC/DC converter, the cables are electrically connected to the output terminal of the DC/DC converter and also electrically connected to a cable connected to each of the adjacent DC/DC converters.

In a similar way, the solar power generation apparatuses 701 are sequentially installed on 10 supports. The outputs from the solar power generation apparatuses are converted into an AC power through the inverter 3 and supplied to the load 4 or system 5.

[Description of Operation]

The main circuits and control circuits of the DC/DC converter 2 and inverter 3 and their operations will be described below in detail with reference to the circuit diagram shown in FIGS. 8 and 9.

Figure 8:
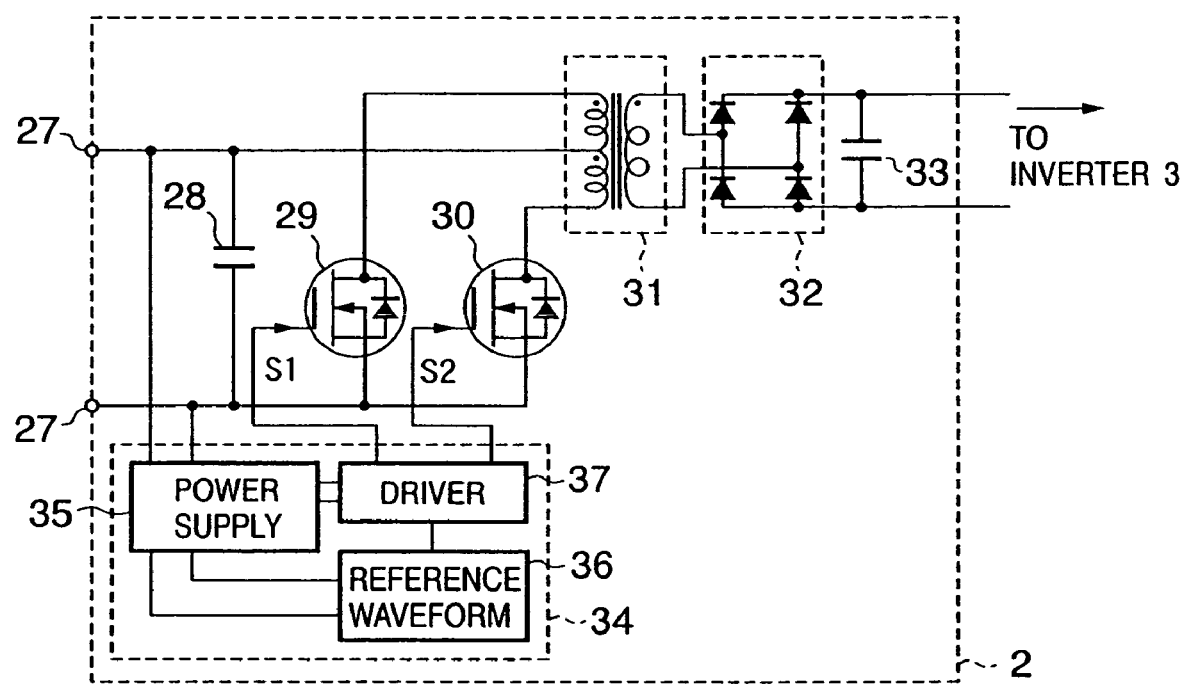
FIG. 8 is a circuit diagram showing an example of a DC/DC converter.

In the DC/DC converter 2 shown in FIG. 8, the output power from the solar cell is stored in a capacitor 28 through an input terminal 27 of the DC/DC converter 2. The power is converted into an AC power by alternately tuning on/off MOSFETs 29 and 30.

The AC power input to a switching transformer 31 is converted into an AC power corresponding to a predetermined transformation ratio (1:175 in this embodiment) and rectified by a diode bridge 32. The AC power passes through a filter capacitor 33 and is output from the DC/DC converter 2 to the inverter 3.

A filter coil may be inserted between the diode bridge 32 and the filter capacitor 33, although it is not used in this embodiment. Depending on the system configuration, both the filter capacitor and filter coil can be omitted.

A control circuit 34 of the DC/DC converter 2 will be described next. The control circuit 34 according to this embodiment comprises a control power supply generation circuit 35, a reference waveform generation circuit 36, and a MOSFET driver 37. The input of the control power supply generation circuit 35 is connected to the both terminals of the capacitor 28. The control signal output from the MOSFET driver 37 is connected to the gates of the MOSFETs 29 and 30.

Detailed operation of the control circuit 34 will be described below. When the voltage of the solar cell 1 reaches the activation voltage of the control power supply generation circuit 35, the output voltage from the control power supply generation circuit 35 is input to the reference waveform generation circuit 36 and MOSFET driver 37.

First, the reference waveform generation circuit 36 operates to input a rectangular wave having a preset reference frequency to the waveform input section of the MOSFET driver 37. Gate drive signals S1 and S2 are input from the MOSFET driver 37 to the gate portions of the MOSFETs 29 and 30 to alternately turn on/off the MOSFETs 29 and 30 at a fixed duty.

Figure 9:
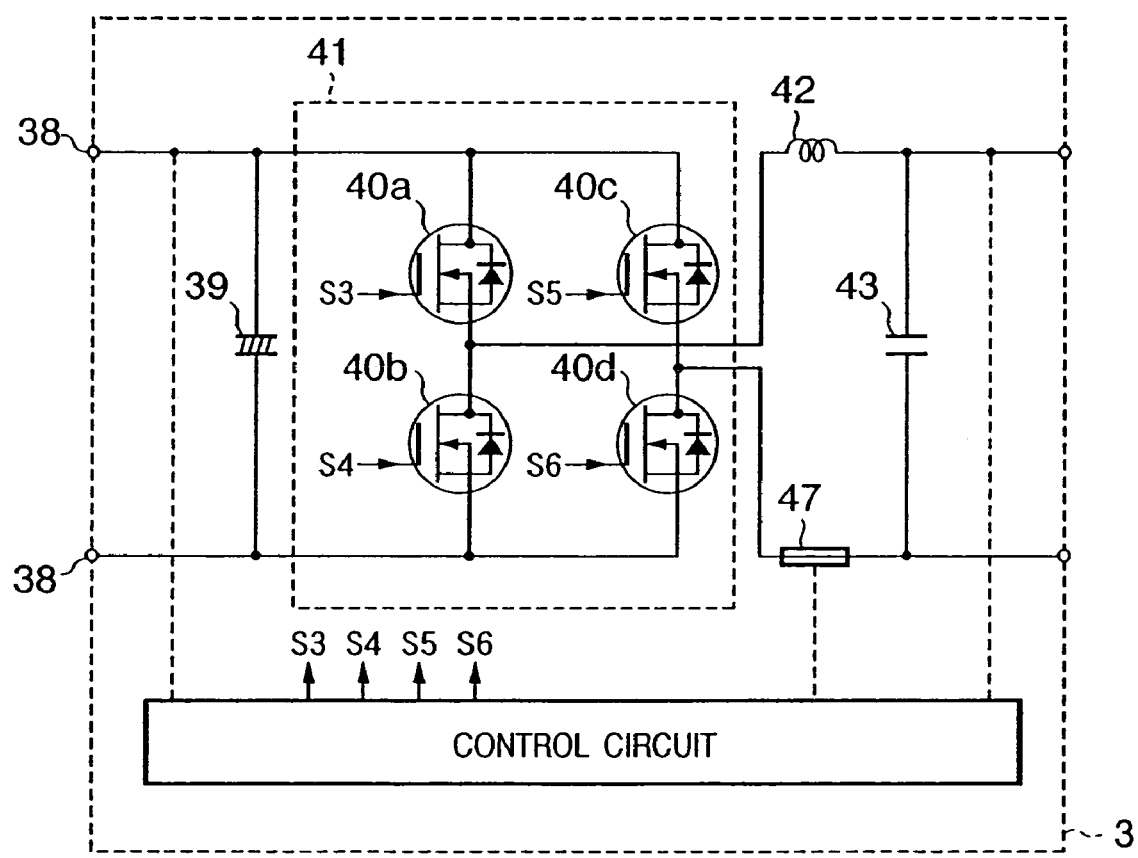
FIG. 9 is a circuit diagram showing an example of an inverter.

As shown in FIG. 9, the main circuit of the inverter 3 comprises input terminals 38 which receive output powers from the plurality of DC/DC converters 2, a smoothing capacitor 39, a full bridge circuit 41 constituted by transistors 40a, 40b, 40c, and 40d, a coil 42, and a capacitor 43.

The control circuit of the inverter 3 is divided into parts that control activation/stop of power conversion, optimization of the operating point of the solar battery, and the operation mode. Only a part related to PWM control relevant to the present invention will be described here in detail with reference to FIG. 21.

Figure 21:
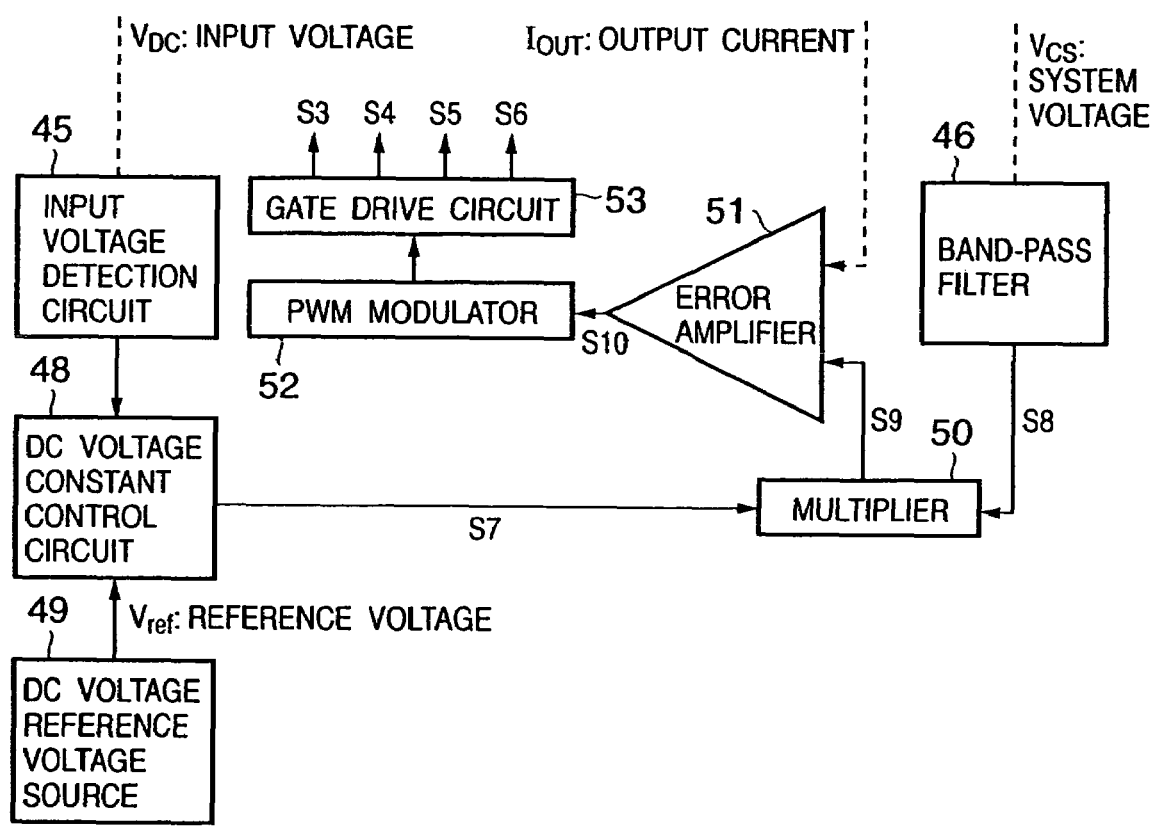
FIG. 21 is a view for explaining the PWM control scheme of the inverter in the present invention.

As shown in FIG. 21, the PWM control section comprises an input voltage detection circuit 45, a band-pass filter (BPF) 46, an output current detector 47 (shown in FIG. 9), a DC voltage constant control circuit 48, a DC voltage reference voltage source 49, a multiplier 50, an output current control error amplifier 51, a PWM modulation circuit 52, and a gate drive circuit 53 which drives the transistors 40a to 40d of the full bridge circuit 41.

As a detailed PWM control method, first, an inverter input voltage $V_{DC}$ is detected by the input voltage detection circuit 45. The DC voltage constant control circuit 48 generates an error signal S7 between the inverter input voltage $V_{DC}$ and a reference voltage $V_{ref}$ from the DC voltage reference voltage source 49. The error signal S7 is input to one input terminal of the multiplier 50. In addition, a system voltage $V_{CS}$ is detected. A fundamental wave component extracted by the BPF 46 is input to the other input terminal of the multiplier 50 as a reference sine wave signal S8. The multiplier 50 multiplies the received error signal S7 by the reference sine wave signal S8 to generate an inverter output current reference signal S9.

The error amplifier 51 receives the inverter output current reference signal S9 from the multiplier 50 and an inverter output current $I_{OUT}$ detected by the output current detector 47, amplifies the difference between the signals, and outputs the amplified signal to the PWM modulation circuit 52 as a modulation reference error signal S10. The PWM modulation circuit 52 executes PWM control on the basis of the received modulation reference signal S10 to drive the transistors 40a to 40d by gate drive signals S3 to S6 through the gate drive circuit 53 so that the inverter input voltage $V_{DC}$ that coincides with the reference voltage $V_{ref}$ can be obtained.

The operation of the full bridge circuit is well-known, and a description thereof will be omitted here.

As described above, when the outputs from the plurality of DC/DC converters 2, which control to ensure a predetermined boost ratio by switching the MOSFETs at a fixed duty, are connected to the inverter 3 which executes input voltage constant control, the DC/DC converters 2 operate at a constant input voltage. This is because the DC/DC converter 2 which execute boost ratio constant control at a fixed duty functions as an impedance converter. As a result, control is performed to make the operating voltage of the solar cell constant.

That is, in this embodiment, when the input voltage of the inverter 3 is set to 175 V, the output voltages from all the DC/DC converters 2 connected to the input side of the inverter 3 become almost 175 V. In accordance with the boost ratio of the switching transformer, the operating voltage of the solar cell 1 becomes about 1 V as the optimum operating voltage.

Input voltage constant control by the inverter 3 has been described above. Instead, a current detection circuit (not shown) may be used at the input section of the inverter 3 to control the input voltage of the inverter 3 such that the power is measured from the voltage and current of the input section of the inverter 3, and maximum power point tracking control is executed to maximize the power.

In this case, the input voltage of the DC/DC converter 2 can be changed, i.e., the output voltage of the solar cell 1 can be changed by changing the input voltage of the inverter 3. Hence, even when solar radiation varies, the output voltage of the solar cell 1, which maximizes the input power to the inverter 3, can be set only by maximum power point tracking control by the inverter 3.

As described above, in this embodiment, a plurality of solar cells are formed on one conductive substrate. The cutting step, end portion etching step, series connection step, and bypass diode connection step, which are necessary for manufacturing a conventional general solar battery module, can be omitted. Accordingly, the manufacture and material cost decreases, and the area power generation efficiency of the solar power generation apparatus largely increases.

The solar cells can easily and accurately be installed at a predetermined interval by installing, on a support, the solar power generation apparatus having the plurality of solar cells formed on one conductive substrate. As compared to conventional installation where solar cells are installed one by one and connected to each other, the time required for installing the solar power generation apparatus can greatly be shortened, and the cost of installation can be reduced.

A DC/DC converter is connected to each of the plurality of solar cells connected in parallel on one conductive substrate. In the conventional structure, a plurality of solar cells are connected in parallel using wiring members, and the outputs from the solar cells are connected to an inverter 3 at once. As compared to this case, when the voltage boost ratio of the DC/DC converter is defined as about n, and a wiring having the same sectional area (same resistance value) as in the conventional case is used, the current collection loss can be decreased to about $(1/n)^2$. In addition, since the sectional area of members used to connect the solar cells or DC/DC converters in parallel can be reduced, the cost of members can greatly be decreased.

Since no solar cells are connected in series, partial shade affects on only the solar cell where the partial shade occurs. The partial shade does not affect the remaining solar power generation apparatuses. Hence, as compared to the conventional system having series-connected solar cells, a solar power generation system that is hardly affected by partial shade can be built. As compared to the conventional system with the same power generation capacity, this effect becomes conspicuous in proportion to the power generation capacity.

In the conventional system having series-connected solar cells, as described above, when the output characteristics of the individual solar cells have a variation, a solar cell with a poor output characteristics affects the remaining solar cells, resulting in a decrease in output of the entire solar power generation system. However, according to the solar power generation system of this embodiment, the influence remains in only the solar cell with the poor output characteristic, like the case of partial shade. Hence, an output corresponding to the output characteristics of the individual solar cells can be extracted. The loss due to the variation in output characteristic can be minimized.

As for the variation in characteristic, since the plurality of solar cell are formed by dividing a solar cell formed on a common conductive substrate by etching in this embodiment, the variation in characteristic between the solar cells is considerably small.

As described above, according to the solar power generation system of this embodiment, a special effect, which cannot be achieved by the prior art, for reducing the shade loss or the loss due to the variation in characteristic can be obtained.

According to the solar power generation apparatus of this embodiment, a plurality of solar cells formed on one conductive substrate are used. Since the semiconductor layer and electrode layers on one conductive substrate are obtained by continuous film formation, the variation in characteristic between solar cells due to factors in manufacturing is small. For this reason, the loss due to the variation in output characteristic can be further decreased.

As described above, according to the solar power generation system of this embodiment, a special effect, which cannot be achieved by the prior art, for reducing the shade loss or the loss due to the variation in characteristic can be obtained.

The DC/DC converters connected to the solar cells are controlled to ensure a predetermined boost ratio at a fixed duty. The inverter to which the plurality of DC/DC converters are connected in parallel executes input voltage constant control or maximum power point tracking control. With this arrangement, the operating point of each solar cells can be controlled by one inverter. Accordingly, the control section of each DC/DC converter can be simplified, the reliability increases, and the cost can be reduced.

In the conventional solar power generation system having series-connected solar cells, if such a live part is to be exposed, the environment-resistant coating of the solar cells is simplified and/or the solar cells are connected in series/ parallel by bare members without any insulating coating. In this case, the following problem is posed.

The live parts of at least some of the electrodes and wiring members of the solar cells and the series/parallel connection members for the solar cells are exposed and non-insulated. The live parts are set in a wet state (a state wherein the resistance between the ground and the solar cell live parts decreases due to the humidity) due to rainwater or the like. When the sun shines then, a leakage current path is formed through [solar cell live parts]-[rainwater]-[wet support]-[rainwater]-[ground] or [solar cell live parts]-[rainwater]-[ground].

As a result, metal ions that constitute the live parts flow out from them to promote corrosion of the electrodes, wiring members, or series/parallel connection members. Especially, when copper is used for the series/parallel connection members, copper remarkably ionizes and elutes due to formation of the current path, resulting in a large decrease in service life of the connection members.

That is, in the conventional solar power generation system, when the plurality of solar cells are connected in series, the potential difference between the ground and the series connection body becomes very large at its most positive pole end, and corrosion of the connection members readily progresses. To cope with this, the solar cells may be connected in parallel. In this case, however, as the number of cells connected in parallel increases, the flowing current amount increases. The current collection loss is proportional to the square of the current amount. If the current collection loss should be suppressed to a predetermined value or less, the sectional area of the parallel connection member must be considerably increased.

According to this embodiment, in the structure in which the live parts of the solar power generation system are exposed to reduce the cost, a DC/DC converter is connected to each solar cell. The potential of the solar cells with respect to the ground is very low, as compared to the conventional system using series connection. Hence, corrosion of the wiring members can be prevented from progressing, and the reliability increases.

SECOND EMBODIMENT

A solar power generation system according to the second embodiment of the present invention will be described below. A description of the same parts as in the first embodiment will be omitted, and characteristic parts of the second embodiment will mainly be described below.

Figure 11:
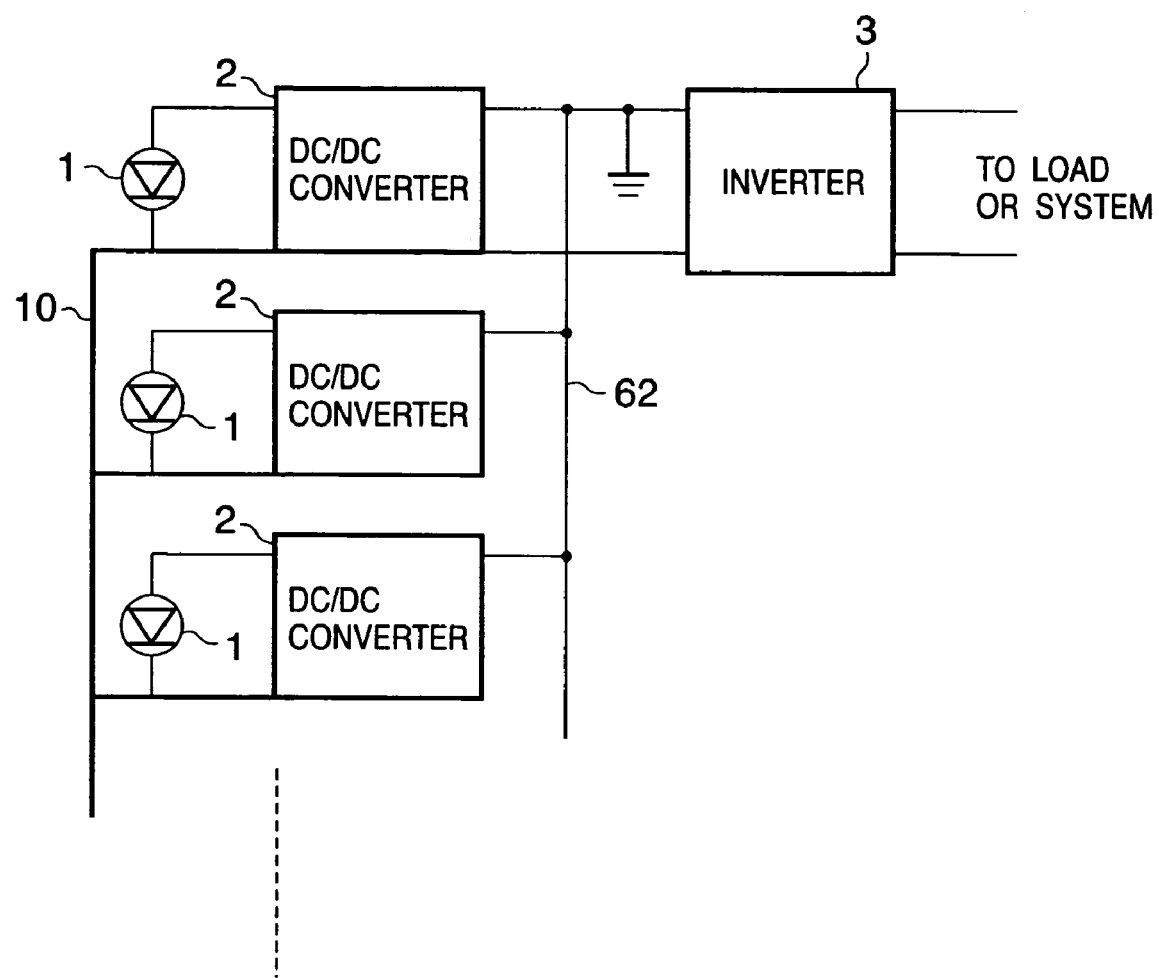
FIG. 11 is a circuit diagram showing the schematic arrangement of the solar power generation system shown in FIG. 10.

FIG. 10 is a schematic view showing the outer appearance of the second embodiment. FIG. 11 is an equivalent circuit diagram of the second embodiment.

In this embodiment, almost the same solar cell assembly as in the first embodiment is used, and a detailed description thereof will be omitted.

Figure 12:
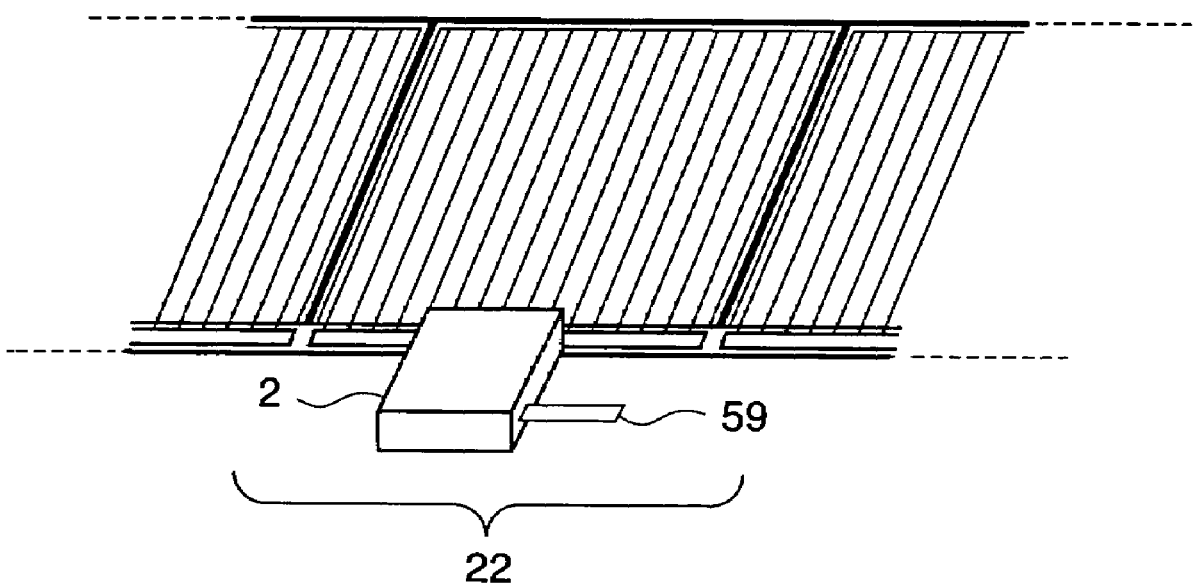
FIG. 12 is a partially enlarged view showing a solar cell shown in FIG. 10.

FIG. 12 is an enlarged view of a connection portion between a DC/DC converter 2 and one of solar cells 22 that constitute the solar cell assembly to which the DC/DC converter used in this embodiment is attached. The attachment position of the DC/DC converter 2 to each solar cell is the same as in the first embodiment except an output terminal 59 extends from the encapsulating portion of the DC/DC converter 2.

The output terminal 59 is a terminal member connected to a high-voltage output terminal of the DC/DC converter 2. To prevent water from entering the DC/DC converter 2 from the lead-out portion of the output terminal 59, the DC/DC converter 2 is filled with a filler.

Figure 13:
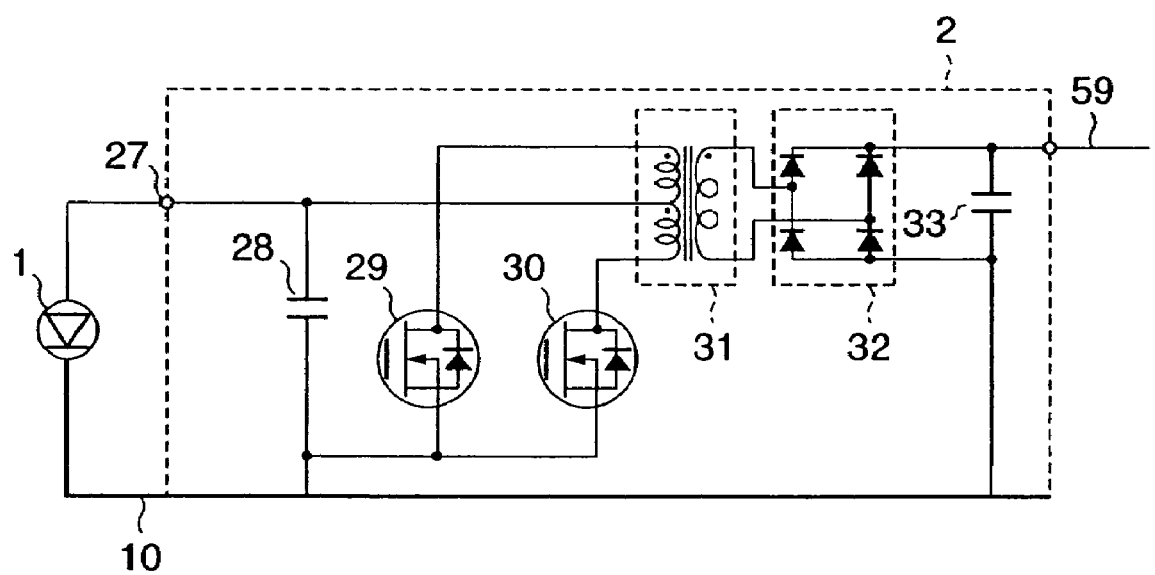
FIG. 13 is a circuit diagram showing connection between the main circuit and the conductive substrate of a DC/DC converter shown in FIG. 10.

As the internal main circuit of the DC/DC converter 2 of this embodiment, the same circuit as in the first embodiment described above with reference to FIG. 8 is used. In this embodiment, as shown in the circuit diagram of FIG. 13, the primary-side low-voltage terminal and secondary-side low-voltage terminal of a switching transformer 31 are electrically connected to a conductive substrate 10 to equalize the primary-side low voltage with the secondary-side low voltage.

As shown in FIG. 14, a copper band 62 having a sectional area of 2 mm$^2$ is bonded to a support 56 in advance as a parallel connection member by using an epoxy adhesive. A plurality of solar cell assemblies to which the DC/DC converters 2 are attached using the epoxy adhesive are bonded and fixed on the support 56. The output terminals 59 extending from the DC/DC converters 2 are sequentially electrically connected to the copper band 62.

An interdevice connection member on the low voltage side is connected to the conductive substrate 10. The interdevice connection member and copper band 62 are input to an inverter 3 so that a DC power output from each DC/DC converter 2 is converted into an AC power and interconnected to a load or the system.

Figure 15:
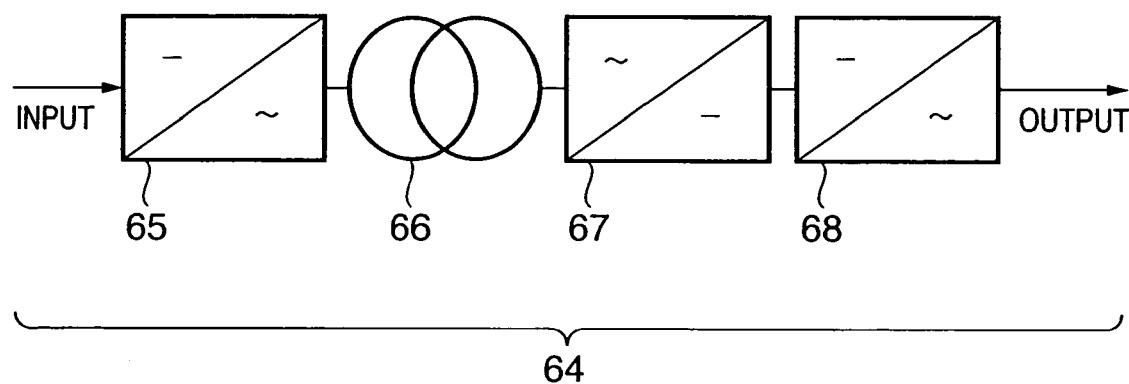
FIG. 15 is a view showing the schematic arrangement of a high-frequency transformer insulating inverter used in the solar power generation system shown in FIG. 10.

In this embodiment, an inverter 64 of high-frequency transformation type as shown in FIG. 15 is used as the inverter 3. In the inverter 64, the DC power output from the DC/DC converter 2 is converted into a high-frequency AC power by a high-frequency inverter 65, insulated by a small high-frequency transformer 66, temporarily converted into a DC power by an AC/DC converter 67, converted again into an AC power having a commercial frequency by a DC/AC converter 68, and then output.

In this embodiment, the solar power generation system is completed by grounding the copper band 62, as shown in FIG. 10. That is, the arrangement of this embodiment is excellent in that since the solar cells of the solar cell assemblies are electrically connected to each other through the conductive substrate in advance, only one member suffices to connect the DC/DC converters.

In this embodiment, to reduce the cost, only the active area is coated with a transparent thin-film resin layer without using any sealing material.

When the copper band 62 serving as the parallel connection member is grounded, as described above, the copper band 62 on the high voltage side of the parallel connection member has a zero potential with respect to the ground, as shown in the equivalent circuit diagram of the solar power generation system shown in FIG. 11.

Hence, the low voltage side of the parallel connection member has a negative potential with respect to the ground. The conductive substrate 10 connected to the low voltage side also has the same potential. The low voltage side of a solar cell 1 also has the negative potential.

At this time, the voltage across the solar cell 1 is less than the potential difference between the copper band 62 and the conductive substrate 10. In addition, the high-voltage side member such as the light-receiving surface terminal member of the solar cell 1 is also kept at the negative potential with respect to the ground. For these reasons, corrosion of the wiring members can be prevented from progressing.

Figure 16:
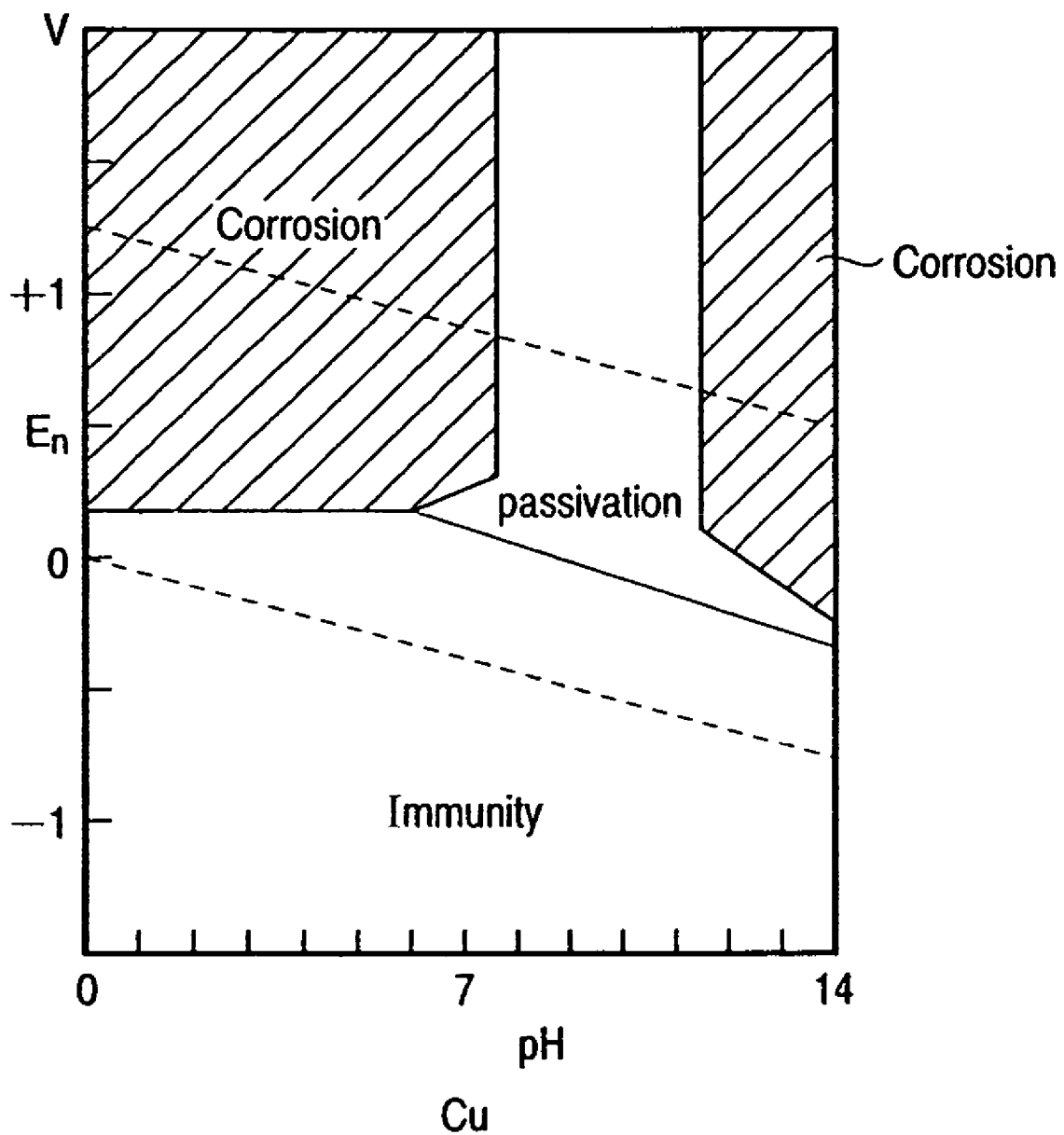
FIG. 16 is a view showing the potential-PH diagram of copper.

In this embodiment, copper (Cu) is used as the connection member and interdevice connection member. As a known physical priority of copper, it readily elutes under a positive potential, as shown in the potential-pH diagram of FIG. 16. In this embodiment, this characteristic is taken into consideration, and elution of copper is prevented by always keeping the wiring member made of copper at a zero or negative potential with respect to the ground.

As described above, the solar power generation system of this embodiment can provide the same effect as in the first embodiment and an additional effect in which since the solar cells and wiring members have a zero or negative potential with respect to the ground, corrosion of wiring electrodes and the like can be suppressed, and the reliability of the solar power generation system can be increased.

THIRD EMBODIMENT

A solar power generation system according to the third embodiment of the present invention will be described below. A description of the same parts as in the first and second embodiments will be omitted, and characteristic parts of the third embodiment will mainly be described below.

The solar cell used in this embodiment has almost the same structure as that used in the first embodiment except the multilayered structure of the semiconductor layer.

More specifically, first, as a lower electrode layer, an Al layer containing 1% Si and having a layer thickness of 5,000 Å is formed by sputtering on a cleaned and rolled long 0.1-mm thick stainless substrate as a conductive substrate. Next, an n/i/p amorphous silicon semiconductor layer is formed. For the p-type semiconductor, $B_2H_6$, $SiH_4$, and $H_2$ gases are used. For the i-type semiconductor, $SiH_4$ and $H_2$ gases are used. For the n-type semiconductor, $PH_3$, $SiH_4$, and $H_2$ gases are used. A 100-Å thick p-type semiconductor layer, 4000-Å thick i-type semiconductor layer, and 300-Å thick n-type semiconductor layer are sequentially formed by plasma CVD.

Another n/i/p amorphous silicon semiconductor layer is formed again to complete a double structure.

Then, a 800-Å thick ITO layer is formed by resistive heating deposition as an upper electrode layer, thereby forming a solar cell.

In accordance with the same procedures as in the first embodiment, a plurality of solar cells are formed on one conductive substrate, as shown in FIG. 7. A DC/DC converter 2 is connected to each solar cell.

Figure 19:
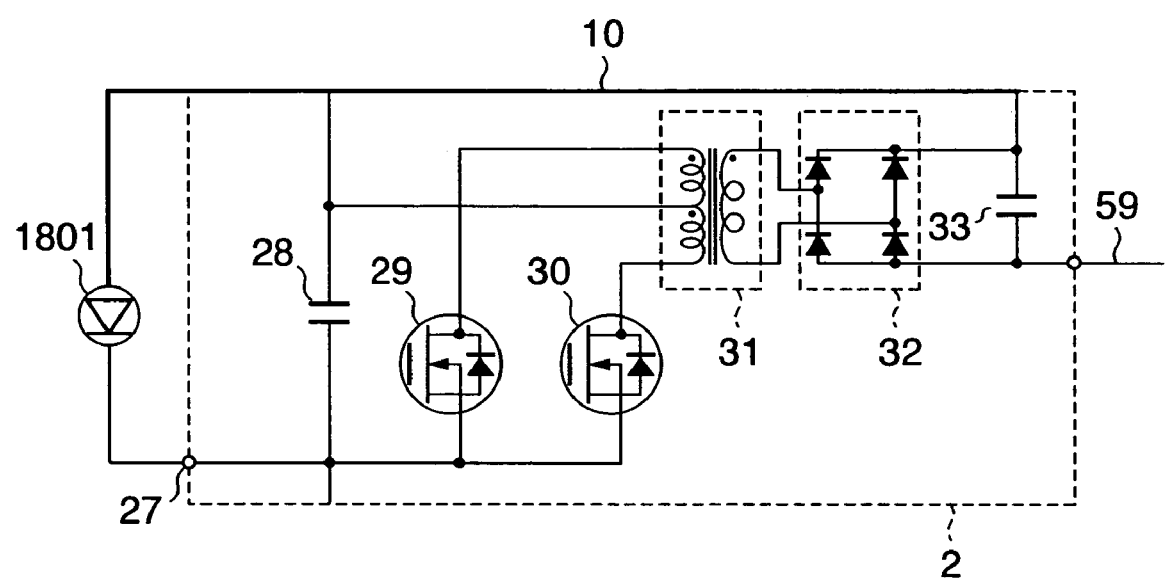
FIG. 19 is a circuit diagram showing connection between the main circuit and the conductive substrate of a DC/DC converter shown in FIG. 17.

In this embodiment, since the n/i/p amorphous silicon semiconductor layer is used for the solar cell, the conductive substrate side corresponds to the high voltage side of the solar cell, unlike the first embodiment. In the main circuit of the DC/DC converter, as shown in FIG. 19, the primary-side high-voltage terminal and secondary-side high-voltage terminal of a switching transformer 31 are electrically connected to a conductive substrate 10 in the DC/DC converter 2 to equalize the primary-side high voltage with the secondary-side high voltage.

As in the second embodiment, the solar power generation apparatus is installed on a support 56 and connected to an inverter. In this embodiment, the conductive substrate 10 is grounded to obtain a solar power generation system according to this embodiment shown in FIG. 17.

As an inverter 3, an inverter of high-frequency transformation type is used, as in the second embodiment.

In this embodiment, a bare copper band is used as the low-voltage side member of the parallel connection member. However, a copper band with an insulating coating can also suitably be used.

Figure 18:
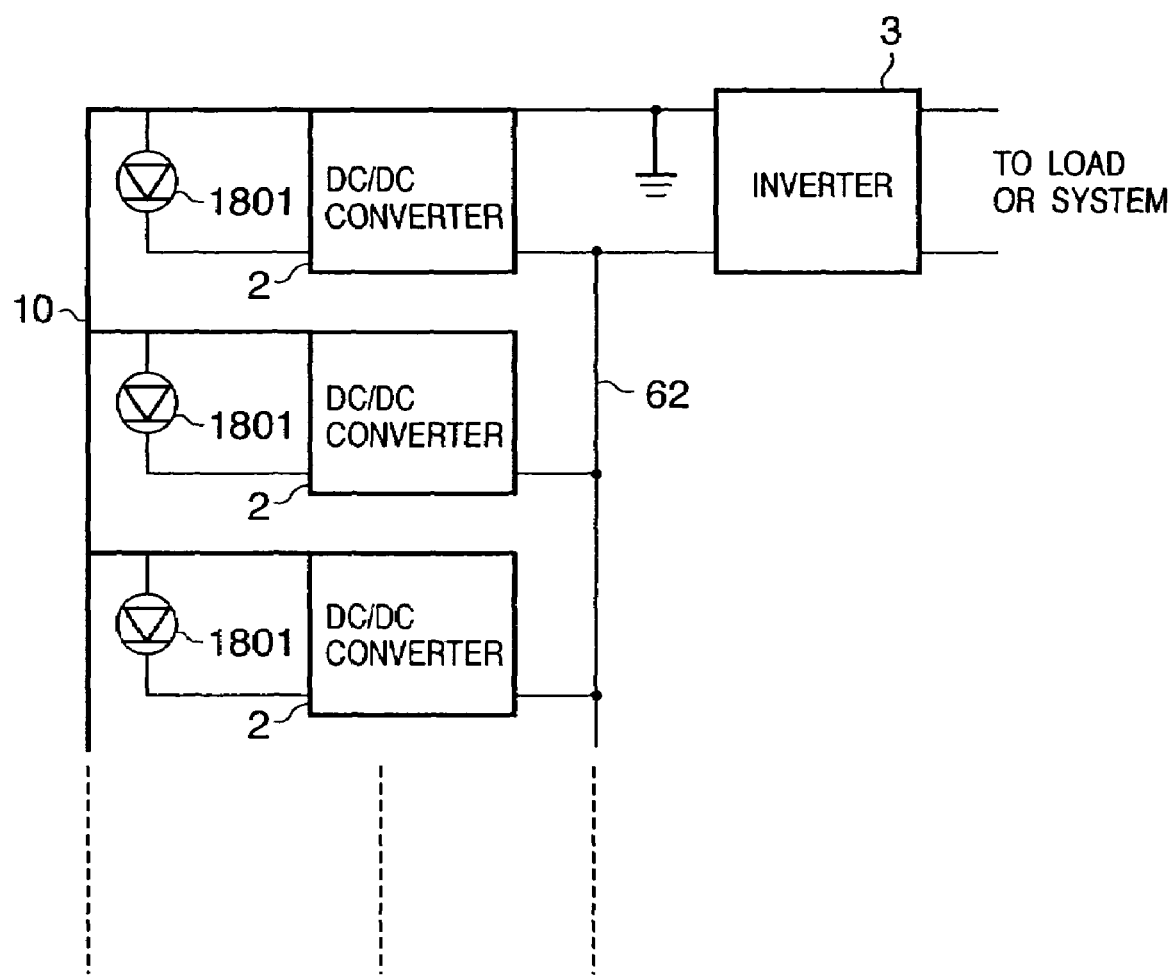
FIG. 18 is a circuit diagram showing the schematic arrangement of the solar power generation system shown in FIG. 17.

In this embodiment, to reduce the cost, only the active area is coated with a transparent thin-film resin layer without using any sealing material. FIG. 18 shows the circuit arrangement of the entire solar power generation system.

As shown in the equivalent circuit diagram of the solar power generation system in FIG. 18, when the conductive substrate 10 as a common electrode of solar cells 1801 is grounded, the high-voltage side of the parallel connection member and interdevice connection member has a zero potential with respect to the ground.

Since all the remaining wiring members are kept at a negative potential with respect to the ground, corrosion of the wiring members can be prevented from progressing.

As described above, the solar power generation system of this embodiment can provide the same effect as in the first embodiment and an additional effect in which since the solar cells and wiring members have a zero or negative potential with respect to the ground, corrosion of wiring electrodes and the like can be suppressed, and the reliability of the solar power generation system can be increased.

EMBODIMENT OF SOLAR POWER GENERATION APPARATUS

A solar power generation apparatus according to still another embodiment of the present invention will be described below. A description of the same parts as in the solar power generation apparatuses of the solar power generation systems according to the first to third embodiments will be omitted, and characteristic parts of this embodiment will mainly be described below.

Figure 20:
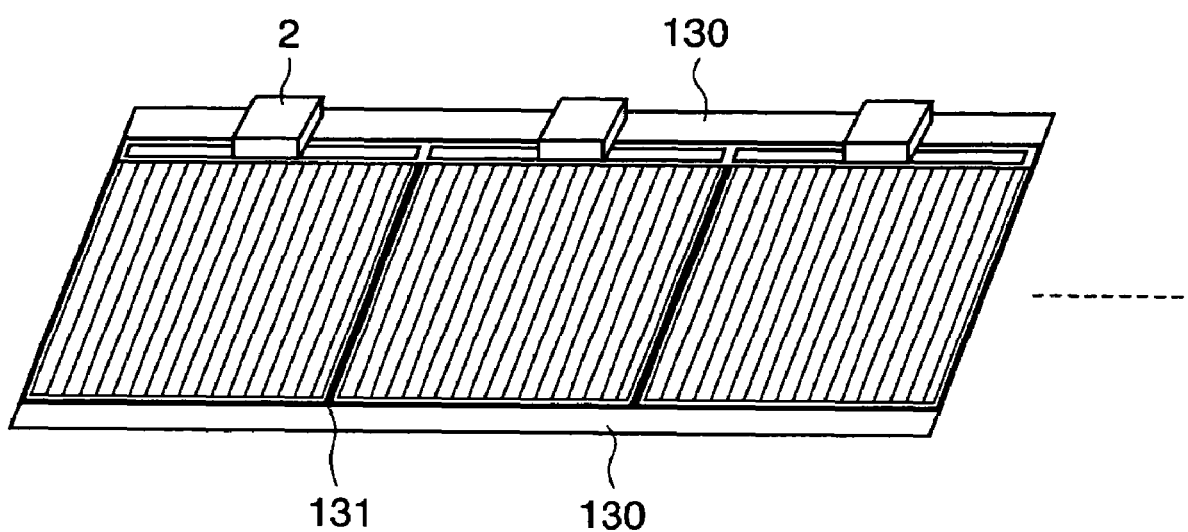
FIG. 20 is a schematic view showing the outer appearance of a solar power generation apparatus according to still another embodiment of the present invention.

FIG. 20 is a view showing part of a solar cell assembly used in the solar power generation apparatus according to this embodiment. As shown in FIG. 20, the solar cell assembly of this embodiment has the same structure as in the solar cell assemblies of the first to third embodiments except installation portions 130 having no semiconductor layer are formed at two ends of a conductive substrate.

The detailed manufacturing method is the same as in the first embodiment. A cleaned and rolled long stainless substrate having a thickness of 0.1 mm is used as a conductive substrate. A lower electrode layer, semiconductor layer, and upper electrode layer are formed on the conductive substrate except 20-mm wide portions from the two ends of the conductive substrate. The portions having no layers are the installation portions 130.

As shown in FIG. 20, portions between the upper electrode layer and the installation portions 130 and parts of the upper electrode layer of the solar cell are linearly removed to form etching lines 131 to cut square-shaped upper electrode layers.

As in the first embodiment, DC/DC converters 2 are attached to constitute a solar power generation apparatus. The solar power generation apparatus is installed on a support.

In this embodiment, the solar power generation apparatus is fixed to a support 56 by driving nails for concrete into the installation portions 130 using a riveting machine.

As the support 56, a concrete member is used. However, it may be a wood or plastic member. In this case, the solar power generation apparatus can be fixed using nails or screws.

As described above, according to this embodiment, the solar power generation apparatus can more easily be installed, and the installation cost can be reduced.

ANOTHER EMBODIMENT OF SOLAR POWER GENERATION APPARATUS

A solar power generation apparatus according to still another embodiment of the present invention will be described below. A description of the same parts as in the above embodiment will be omitted, and characteristic parts of this embodiment will mainly be described below.

Figure 22:
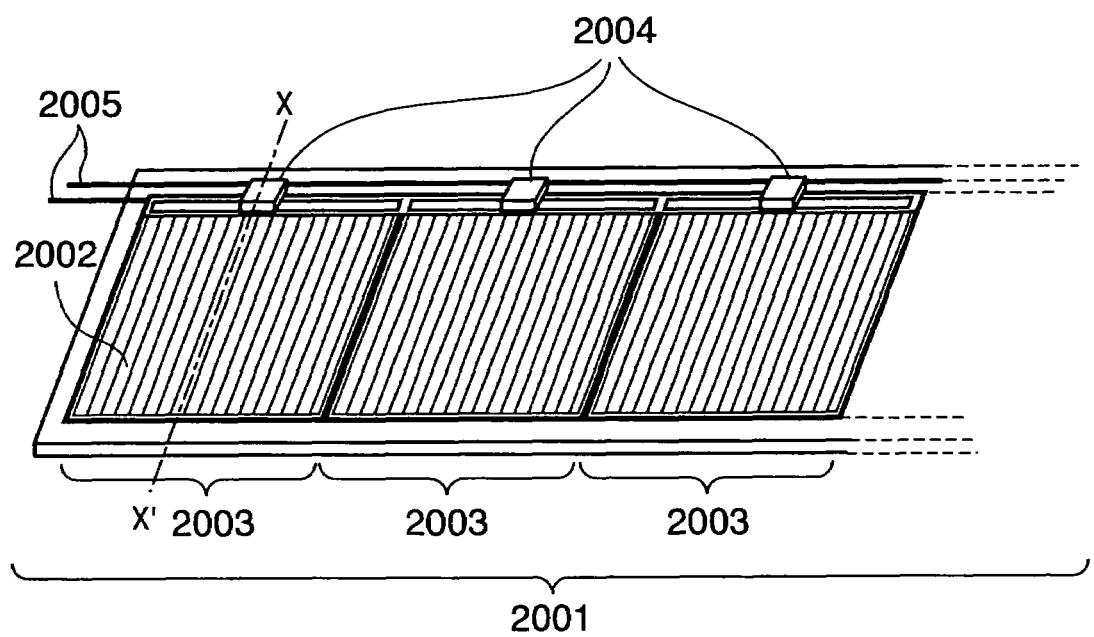
FIG. 22 is a schematic view showing the outer appearance of a solar power generation apparatus according to still another embodiment of the present invention.

FIG. 22 is a view showing the schematic arrangement of this embodiment. As shown in FIG. 22, in a solar power generation apparatus 2001 of this embodiment, a DC/DC converter 2004 is connected to each of solar cells 2003 of solar cell assembly 2002.

As the solar cell assembly 2002 used in this embodiment, the same solar cell assembly before the transparent thin-film resin layer application step in the second embodiment is used. The DC/DC converter 2004 is electrically connected to the light-receiving surface terminal member of each solar cell 2003 and the conductive substrate.

An output terminal (not shown) of each DC/DC converter 2004 is electrically connected to a terminal member 2005. Accordingly, all the DC/DC converters 2004 are connected in parallel.

Figure 23:
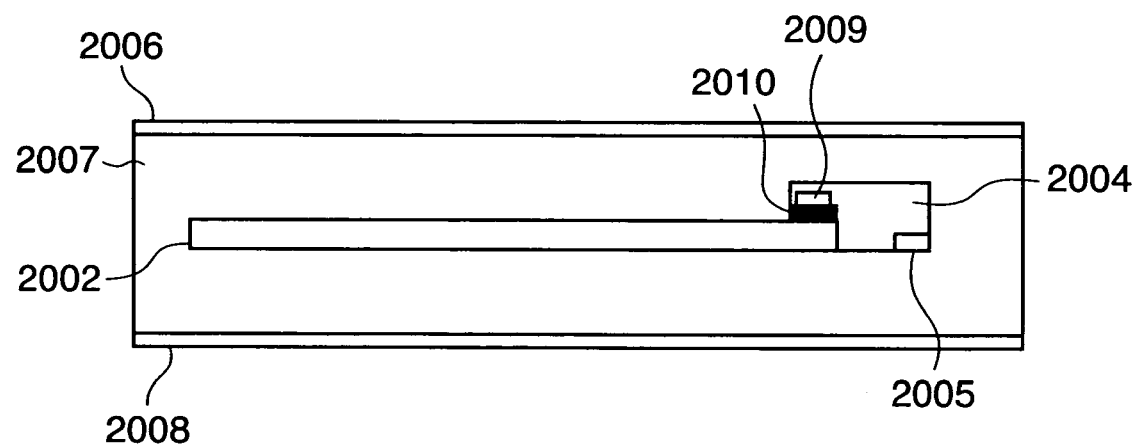
FIG. 23 is a sectional view taken along a line X-X' in FIG. 22.

In this embodiment, the entire solar cell assembly in which the DC/DC converters are connected is sealed using a weather-resistant film, filler, and back reinforcing member. FIG. 23 is a sectional view taken along a line X-X' in FIG. 22. Reference numeral 2006 denotes a weather-resistant film; 2007, a filler; 2008, a back reinforcing member; 2009, a light-receiving surface terminal member; and 2010, double-coated adhesive tape.

Detailed examples of materials to be used for sealing are as follows. As the weather-resistant film 2006, ETFE (ethylene tetrafluoroethylene) is preferably used. As the filler 2007, EVA (ethylene-vinyl acetate copolymer, weather-resistant grade) is preferably used. As the back reinforcing member 2008, a Tedlar/Al/Tedlar sheet is preferably used.

As a sealing method, a multilayered structure is formed by sequentially stacking the back reinforcing member, filler, solar cell assembly, filler, and weather-resistant film, and the filler is melted at 150° C. using a vacuum laminator.

At this time, when the terminal member 2005 extending from the solar cell assembly is exposed from the end portion of the sealing material, the solar cell assembly can be electrically connected to an adjacent solar power generation apparatus or inverter using the terminal member 2005.

According to the solar power generation apparatus of this embodiment, the same effect as in the second embodiment can be obtained.

OTHER EMBODIMENT

In the above embodiments, solar power generation systems using solar cells as a DC power supply have been described. However, the present invention can also be applied to a power conversion system which uses not solar cells but various power supplies such as a fuel battery, thermocouple, or plasma power generation apparatus as a DC power supply. The present invention can provide a large effect especially when the output characteristics of a plurality of DC power supplies vary.

In the system of the present invention, the power is supplied to a system. The power may be supplied not to a commercial AC power system but to any other AC power system such as a local AC power generation equipment in a factory, as a matter of course.

As is apparent, many different embodiments of the present invention can be made without departing from the spirit and scope thereof, so it is to be understood that the invention is not limited to the specific embodiments thereof except as defined in the appended claims.

Industrial Applicability

The present invention can be applied to a solar power generation apparatus and solar power generation system having a plurality of solar cells. The plurality of solar cells are formed on a common substrate. A converter that converts the output from a solar cell is connected to each solar cell to form a solar power generation apparatus. Since the plurality of solar cells are formed on one substrate, the cutting step, end portion etching step, series connection step, and bypass diode connection step, which are necessary for manufacturing a conventional general solar battery module, can be omitted. Accordingly, the manufacture and material cost decreases, and the area power generation efficiency of the solar power generation apparatus largely increases.

In addition, the work for installing the solar cells at a predetermined interval can be executed for each solar power generation apparatus, the time required for installing the solar power generation apparatus can greatly be shortened, and the cost of installation can be reduced.

The invention claimed is:

1. A solar power generation system comprising:
a plurality of solar cells formed on a common conductive substrate;
a plurality of DC/DC converters which are connected to said solar cells, respectively, to boost voltage of DC power output from the connected solar cells; and
an inverter which converts DC power output from said plurality of DC/DC converters into AC power,
wherein each of said plurality of DC/DC converters comprises first and second input terminals and first and second output terminals,
wherein each of said solar cells comprises a first electrode electrically connected to the common conductive substrate, and a second electrode electrically connected to the first input terminal of one of said plurality of DC/DC converters,
wherein the second input terminal and the first output terminal of each of said plurality of DC/DC converters are electrically connected to the common conductive substrate for connecting said plurality of DC/DC converters in parallel electrical relation, and
wherein the second output terminal of one of said plurality of DC/DC converters is connected to the second output terminal of another one of said plurality of DC/DC converters,
wherein said inverter has an insulating transformer to insulate between an input and an output of said inverter, and
wherein a connection member which electrically connects said plurality of DC/DC converters to said inverter is grounded.

2. The system according to claim 1, wherein the AC power output from said inverter is connected to one of a load and a commercial power system.

* * * * *